(12) United States Patent
Yamazaki et al.

(10) Patent No.: US 8,339,039 B2
(45) Date of Patent: Dec. 25, 2012

(54) LIGHT-EMITTING ELEMENT INCLUDING INTERMEDIATE CONDUCTIVE LAYER HAVING AN ELECTRON-INJECTION LAYER WITH AN ISLAND-LIKE STRUCTURE

(75) Inventors: Shunpei Yamazaki, Tokyo (JP); Ryoji Nomura, Kanagawa (JP); Satoshi Seo, Kanagawa (JP); Hiroko Abe, Tokyo (JP); Yasuo Nakamura, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/229,918

(22) Filed: Sep. 12, 2011

(65) Prior Publication Data

US 2012/0061653 A1    Mar. 15, 2012

Related U.S. Application Data

(63) Continuation of application No. 11/587,843, filed as application No. PCT/JP2005/009312 on May 17, 2005, now Pat. No. 8,018,152.

(30) Foreign Application Priority Data

May 20, 2004  (JP) ................................. 2004-151103

(51) Int. Cl.
    *H01L 51/50*   (2006.01)
(52) U.S. Cl. .......... 313/509; 313/507; 313/508; 257/40; 257/103; 315/169.1
(58) Field of Classification Search ........... 313/500–512
    See application file for complete search history.

(56) References Cited

U.S. PATENT DOCUMENTS 6,107,734 A    8/2000  Tanaka et al.
6,284,393 B1   9/2001  Hosokawa et al.
(Continued)

FOREIGN PATENT DOCUMENTS

EP    0 845 924 A2   6/1998
(Continued)

OTHER PUBLICATIONS

Tokito, S. et al, "Metal Oxides as a Hole-Injecting Layer for an Organic Electroluminescent Device," J. Phys. D. Appl. Phys., vol. 29, Jul. 1996, pp. 2750-2753.

(Continued)

*Primary Examiner* — Tracie Y Green
(74) *Attorney, Agent, or Firm* — Husch Blackwell LLP

(57) ABSTRACT

When a light-emitting element having an intermediate conductive layer between a plurality of light-emitting layers is formed, the intermediate conductive layer can have transparency; and thus, materials are largely limited and the manufacturing process of an element becomes complicated by a conventional method. A light-emitting element according to the present invention is formed by sequentially stacking a pixel electrode, a first light-emitting layer, an intermediate conductive layer (including an electron injecting layer and a hole-injecting layer, one of which is island-like), a second light-emitting layer and an opposite electrode. Therefore, the present invention can provide a light-emitting element typified by an organic EL element in which a range of choice of materials that can be used as the intermediate conductive layer is broadened extremely, and which can realize a high light-emitting efficiency, a low power consumption and a high reliability, and further a display device using the light-emitting element.

42 Claims, 16 Drawing Sheets

U.S. PATENT DOCUMENTS

| | | |
|---|---|---|
| 6,429,584 B2 | 8/2002 | Kubota |
| 6,515,310 B2 | 2/2003 | Yamazaki et al. |
| 6,706,544 B2 | 3/2004 | Yamazaki et al. |
| 6,858,878 B2 | 2/2005 | Yamazaki et al. |
| 6,872,472 B2 | 3/2005 | Liao et al. |
| 6,936,959 B2 | 8/2005 | Hamada et al. |
| 6,936,961 B2 | 8/2005 | Liao et al. |
| 6,956,324 B2 | 10/2005 | Yamazaki |
| 7,291,969 B2 | 11/2007 | Tsutsui |
| 7,732,808 B2 | 6/2010 | Ikeda et al. |
| 2001/0055841 A1 | 12/2001 | Yamazaki et al. |
| 2002/0030193 A1 | 3/2002 | Yamazaki et al. |
| 2002/0044124 A1 | 4/2002 | Yamazaki et al. |
| 2003/0127967 A1 | 7/2003 | Tsutsui et al. |
| 2003/0170491 A1 | 9/2003 | Liao et al. |
| 2003/0189401 A1 | 10/2003 | Kido et al. |
| 2003/0218166 A1 | 11/2003 | Tsutsui |
| 2004/0022664 A1 | 2/2004 | Kubota et al. |
| 2004/0027059 A1 | 2/2004 | Tsutsui |
| 2004/0144982 A1 | 7/2004 | Yamazaki et al. |
| 2004/0150333 A1 | 8/2004 | Tsutsui |
| 2004/0227460 A1 | 11/2004 | Liao et al. |
| 2005/0001541 A1 | 1/2005 | Yamazaki et al. |
| 2005/0029933 A1 | 2/2005 | Liao et al. |
| 2005/0098207 A1 | 5/2005 | Matsumoto et al. |
| 2005/0156197 A1 | 7/2005 | Tsutsui et al. |
| 2005/0242713 A1 | 11/2005 | Yamazaki |
| 2005/0248270 A1 | 11/2005 | Ghosh et al. |
| 2006/0014465 A1 | 1/2006 | Yamazaki |
| 2006/0091797 A1 | 5/2006 | Tsutsui et al. |
| 2008/0150420 A1 | 6/2008 | Tsutsui |
| 2010/0096627 A1 | 4/2010 | Ikeda et al. |
| 2010/0207518 A1 | 8/2010 | Ikeda et al. |
| 2012/0007067 A1* | 1/2012 | Kaneta et al. .................. 257/40 |
| 2012/0168753 A1* | 7/2012 | Sanga ............................. 257/52 |

FOREIGN PATENT DOCUMENTS

| | | |
|---|---|---|
| EP | 1 119 221 A2 | 7/2001 |
| EP | 1 119 222 A2 | 7/2001 |
| EP | 1 339 112 A2 | 8/2003 |
| EP | 1 351 558 A1 | 10/2003 |
| EP | 1 388 904 A2 | 2/2004 |
| EP | 1 478 025 A2 | 11/2004 |
| EP | 1 530 245 A2 | 5/2005 |
| EP | 1 530 245 A3 | 5/2005 |
| EP | 2 065 950 A2 | 6/2009 |
| JP | 8-222375 | 8/1996 |
| JP | 10-255982 | 9/1998 |
| JP | 10-294182 | 11/1998 |
| JP | 10-308284 | 11/1998 |
| JP | 11-329748 | 11/1999 |
| JP | 2002-93586 | 3/2002 |
| JP | 2003-45676 | 2/2003 |
| JP | 2003-89864 | 3/2003 |
| JP | 2003-217867 | 7/2003 |
| JP | 2003-264085 | 9/2003 |
| JP | 2003-272860 | 9/2003 |
| JP | 2003-272867 | 9/2003 |
| JP | 2003-323987 | 11/2003 |
| JP | 2003-332070 | 11/2003 |
| JP | 2004-39617 | 2/2004 |
| JP | 2004-95546 | 3/2004 |
| JP | 2005-166637 | 6/2005 |
| JP | 3748110 | 2/2006 |
| WO | WO 2005/031798 A2 | 4/2005 |
| WO | WO 2005/115060 A1 | 12/2005 |

OTHER PUBLICATIONS

International Search Report re application No. PCT/JP2005/009312, dated Sep. 13, 2005.

Written Opinion re application No. PCT/JP2005/009312, dated Sep. 13, 2005.

* cited by examiner

WHITE LIGHT-EMISSION

WHITE LIGHT-EMISSION

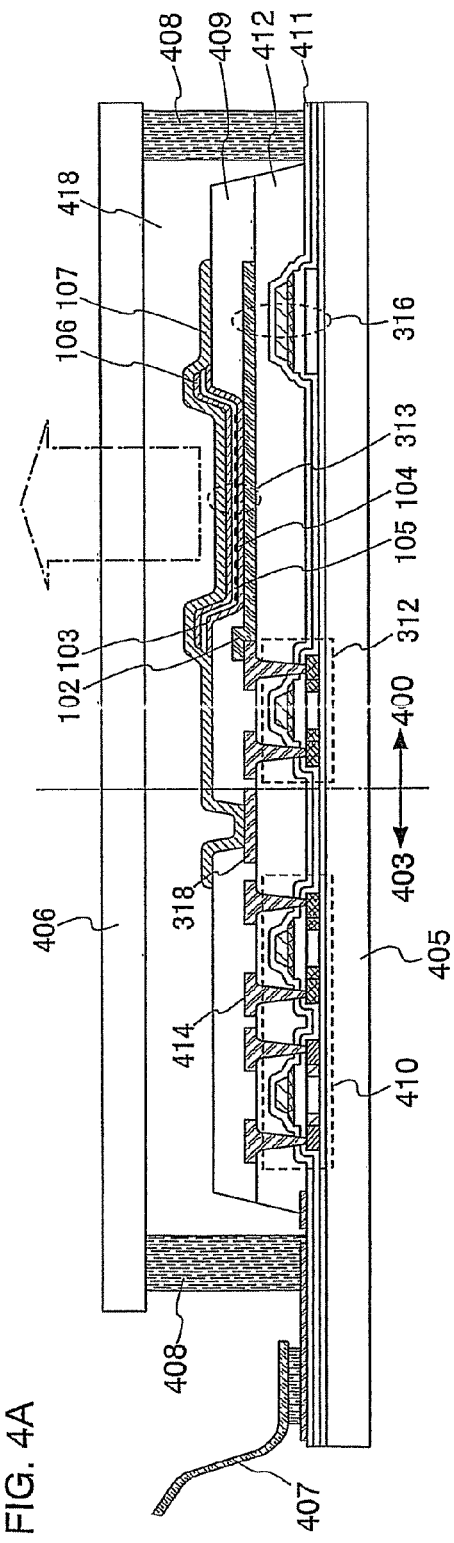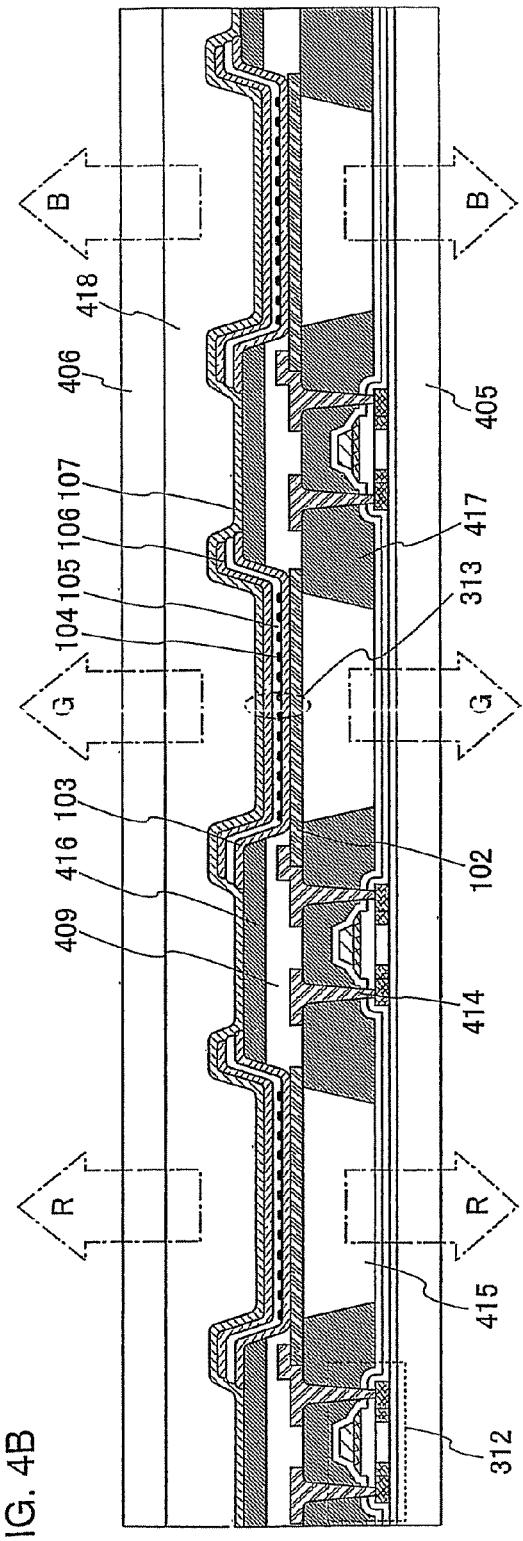

LIGHT-EMITTING ELEMENT INCLUDING INTERMEDIATE CONDUCTIVE LAYER HAVING AN ELECTRON-INJECTION LAYER WITH AN ISLAND-LIKE STRUCTURE

This application is a continuation of application Ser. No. 11/587,843 filed on Oct. 26, 2006 now U.S. Pat. No. 8,018,152 which is the US national stage of PCT/JP2005/009312 filed May 17, 2005.

TECHNICAL FIELD

The present invention relates to an element having a structure in which an anode, a cathode, and a thin film sandwiched between the anode and the cathode are formed, and the thin film emits light with a phenomenon called electroluminescence (hereinafter, also referred to as EL) (hereinafter, referred to as a light-emitting element) and to a display device provided with the light-emitting element over a substrate. Further, the present invention relates to an electronic device in which the light-emitting element is provided in an image-display portion.

BACKGROUND ART

An EL display is one of light-emitting devices that have attracted most attentions as the next generation flat panel display. In a light-emitting element used for a light-emitting device, a thin film containing an organic compound (hereinafter, referred to as an organic thin film) is formed between two electrodes, and current is applied to the electrodes to generate electroluminescence. Electrons injected from a cathode and holes injected from an anode are recombined in an organic thin film to form a molecular exciton, and when the molecular exciton returns to a ground state, photons are emitted, in other words, light is emitted. At this time, one electron and one hole are recombined to form one molecular exciton. When the molecular exciton is deactivated to the ground state with luminescence, one photon of a wavelength corresponding to energy difference between the excited state and the ground state is emitted (which is called a radiation process).

In a conventional organic EL element, an organic thin film is sandwiched by a pair of an anode and a cathode. Therefore, a ratio of the number of holes and electrons injected from the anode and the cathode (hereinafter, also referred to as carriers in the case where holes and electrons are not distinguished) and the number of emitted photons, in other words, the quantum efficiency is not higher than 1.

As one of methods for solving such a constraint, there is proposed a method for forming an intermediate conductive layer in an element, in addition to the cathode and anode (Reference 1: Japanese Patent Laid-Open No. H11-329748, pp. 6 to 7 and FIG. 3).

According to Reference 1, an organic EL element is proposed, in which an Alq:Li layer 13 including Alq (Al complex of 8-hydroxyquinoline) and Li, and an In—Zn—O (indium.zinc oxide) layer 14 are formed in an element sandwiched by a pair of an anode 11 and a cathode 12, and organic layers 15 and 16 are formed on the opposite sides, namely, the anodes side and the cathode side of the layers (FIG. 14). Note that reference numeral 17 denotes an interlayer insulating film. Here, the layer in which the Alq:Li layer and the In—Th—O layer are stacked is defined as an intermediate conductive layer. In an organic EL element having such a structure, holes and electrons are injected from an anode and a cathode, respectively, as in a general organic EL element. The holes and electrons are transported to the cathode side and the anode side, respectively. The characteristic point here is that carriers are supplied also from the intermediate conductive layer. In other words, electrons are injected into the organic layer 15 from the anode side (Alq:Li layer 13 side) of the intermediate conductive layer, and at the same time, holes are injected into the organic layer 16 from the cathode side (In—Zn—O layer 14 side) of the intermediate conductive layer. In the organic layer 15 on the anode side, holes injected from the anode 11 and electrons injected from the intermediate conductive layers 13 and 14 are recombined to generate a molecular exciton, which leads to luminescence (light-emission). Similarly, in the organic layer 16 on the cathode side, electrons injected from the cathode 12 and holes injected from the intermediate conductive layers 13 and 14 are recombined to generate a molecular exciton, and light-emission is obtained by the radiation process of the molecular exciton.

By the above described mechanism, this organic EL element can provide almost the same effect as the case where general organic EL elements are arranged serially. In other words, although the driving voltage of the organic EL element becomes almost twice higher than a general organic EL element, the number of obtained photons with the same current density becomes twice more than that of the general organic EL element. Therefore, the quantum efficiency almost doubles. It is also possible that the quantum efficiency can be further increased by applying this method. For example, two intermediate conductive layers and three organic thin films are arranged alternately, thereby obtaining almost the same effect as that obtained when three organic EL elements are arranged serially. Therefore, although the driving voltage becomes almost three times higher, the quantum efficiency becomes almost three times higher at the same time. Consequently, a high-luminance organic EL element can be provided.

The requirement for realizing this idea is that the intermediate conductive layer sandwiched by organic layers is transparent. A material that can be used as the intermediate conductive layer is limited so as to fulfill this requirement. Until now, there have been proposed various materials. However, materials that have been used actually are limited to the followings: 1: a stacked layer of a mixed layer containing an electron transporting compound such as Alq or bathocuproin (BCP) and an electron injecting compound such as an alkali metal and a transparent electrode such as ITO (indium tin oxide) or IZO (indium zinc oxide); 2: a stacked layer of the mixed layer containing the electron transporting compound and the electron injecting compound and a metal oxide; 3: a stacked layer of the mixed layer containing the electron transporting compound and the electron injecting compound and an electron-accepting organic compound, and the like.

By using the above described materials, the intermediate conductive layer can keep transparency; however, the material is largely limited and a manufacturing process of an element becomes also complicated. For example, according to the method described in Reference 1, in general, an organic layer is formed by a vacuum vapor deposition method. By this method, a mixed layer of an electron transporting compound and an electron injecting compound can be easily formed on the organic layer. However, a transparent electrode such as ITO or IZO cannot be formed by a vacuum vapor deposition method and formed by a sputtering method. Therefore, such transparent electrodes should be formed after an element is transferred into a chamber for forming a film by a sputtering method from a chamber for an evaporation method, and thus the manufacturing process becomes complicated.

Further, as for the technique related to Reference 1, there are known an organic EL (electroluminescence) element, as shown in References 2 (Japanese Patent Laid-Open No. 2003-45676 p. 1 FIG. 3) and 3 (Japanese Patent Laid-Open No. 2003-272860 p. 1 FIG. 8), in which a plurality of light-emitting units are separated by one layer forming an equipotential surface, and an organic EL element having a structure in which a conductor thin film layer is interposed between two organic EL layers as shown in Reference 4 (Japanese Patent Laid-Open No. 2003-264085 p. 11 FIG. 7).

DISCLOSURE OF INVENTION

The present invention has been made in view of the above described problems. It is an object of the present invention to provide a light-emitting element typified by an organic EL element in which a range of choice of a material that can be used as an intermediate conductive layer sandwiched by organic thin films functioning as a light-emitting layer is broadened extremely, and which can realize a high light-emitting efficiency, a low power consumption and a high reliability, and further a display device (light-emitting device) using the light-emitting element.

One feature of a light-emitting element according to the present invention is that it has a stacked structure in which a first electrode, a first light-emitting layer, an intermediate conductive layer, a second light-emitting layer, and a second electrode, where the intermediate conductive layer comprises an electron injecting layer and a hole-injecting layer that is in contact with the electron injecting layer, and where at least one of the electron-injecting layer and the hole-injecting layer is an island-like layer. Herein, the first electrode may have a function of an anode or a cathode. On the other hand, the second electrode may have an opposite polarity of the first electrode and may be an anode or a cathode. In addition, an island-like electron-injecting layer and the hole-injecting layer are collectively referred to as the intermediate conductive layer, and the layer can select appropriately a stacking sequence thereof depending on the polarities of the first electrode and the second electrode. Instead of forming the election-injecting layer as island-like layer, the hole-injecting layer may be island-like. Alternatively, the both layers may be island-like. Note that "island-like" herein means that elements (layers) are dotted in an island-shaped state and may be dot-like, protrusion-like, cluster-like (such dots or protrusions aggregates) or the like, and the shape is not limited. Further, "the island-like layer" has at least one island-like structure. Arrangement in an island-shaped manner/state may be at random or intentional. In any cases, it may have any structure as long as the electron-injecting layer of the intermediate conductive layer is in contact with a light-emitting layer on the anode side, and the hole-injecting layer is in contact with a light-emitting layer on the cathode side, and further the electron-injecting layer and the hole-injecting layer are in contact with each other. Here, the first electrode is a pixel electrode and the second electrode is an opposite electrode.

In a light emitting element according to the present invention described above, a third light-emitting layer may be formed over the second light-emitting layer with an intermediate conductive layer to be formed anew (an electron-injecting layer and a hole-injecting layer) therebetween. In this case, at least one of the electron-injecting layer and the hole-injecting layer contained in at least one of the intermediate conductive layers preferably has an island-like structure. That is, when a light-emitting element has three light-emitting layers, two intermediate conductive layers are sandwiched; however, at least one of the electron-injecting layer and the hole-injecting layer that exist in at least one of the two intermediate conductive layers is preferably island-like. Note that the number of light-emitting layers and intermediate conductive layers that are stacked is not limited in particular. For example, when a light-emitting element has four light-emitting layers, three intermediate conductive layers are sandwiched in the light-emitting layer. Alternatively, when a light-emitting element has five light-emitting layers, four intermediate conductive layers are sandwiched in the light-emitting layer.

Specifically, the light-emitting element includes a structure in which a first electrode, a plurality of light-emitting layers, a plurality of intermediate conductive layers sandwiched by the plurality of light-emitting layers, a second electrode are stacked. The intermediate conductive layer includes an electron injecting layer and a hole injecting layer that is in contact with the electron injecting layer, and at least one of the electron injecting layer and the hole injecting layer is an island-like layer.

Further specifically, the light emitting element is formed by sequentially stacking an n number of light-emitting layers (where n is an integer equal to or greater than 2) comprising a first through an n-th light-emitting layers between a first electrode and a second electrode, and an intermediate conductive layer is formed between a k-th light-emitting layer (where k is an integer of $1 \leq k \leq (n-1)$) and a (k+1)th light-emitting layer. Further, the intermediate conductive layer comprises an electron injecting layer and a hole-injecting layer that is in contact with the electron injecting layer, and at least one of the electron-injecting layer and the hole-injecting layer is an island-like layer. Here, the first electrode is a pixel electrode and the second electrode is an opposite electrode.

A display device according to the present invention includes a transistor formed over a substrate, and a light-emitting element connected to the transistor through an interlayer insulating film, wherein the light-emitting element has a first electrode, a first light-emitting layer, an intermediate conductive layer, a second light-emitting layer, and a second electrode, where the intermediate conductive layer comprises an electron injecting layer and a hole injecting layer that is in contact with the electron injecting layer, and at least one of the electron-injecting layer and the hole-injecting layer is an island-like layer. Herein, the first electrode of the light-emitting element may have a function of an anode or a cathode. On the other hand, the second electrode may have an opposite polarity of the first electrode and may be an anode or a cathode. In addition, an island-like electron-injecting layer and the hole-injecting layer are collectively referred to as the intermediate conductive layer, and the layer can select appropriately a stacking sequence depending on the polarities of the first electrode and the second electrode. Instead of forming the electron-injecting layer as an island-like layer, the hole-injecting layer may be island-like. Alternatively, the both layers may be island-like. In any cases, it may have any structure as long as the electron-injecting layer of the intermediate conductive layer is in contact with a light-emitting layer on the anode side, and the hole-injecting layer is in contact with a light-emitting layer on the cathode side, and further the electron-injecting layer and the hole-injecting layer are in contact with each other. Here, the first electrode is a pixel electrode and the second electrode is an opposite electrode.

In a light emitting element according to the present invention described above, a third light-emitting layer may be formed over the second light-emitting layer with an intermediate conductive layer to be formed anew (an electron-injecting layer and a hole-injecting layer) therebetween. In this case, at least one of the electron-injecting layer and the hole-injecting layer contained in at least one of the intermediate conductive layers preferably has an island-like structure. That is, when a light-emitting element has three light-emitting layers, two intermediate conductive layers are sandwiched; however, at least one of the electron-injecting layer and the hole-injecting layer that exist in at least one of the two intermediate conductive layers is preferably island-like. Note that the number of light-emitting layers and intermediate conductive layers that are stacked is not limited in particular. For example, when a light-emitting element has four light-emitting layers, three intermediate conductive layers are sandwiched in the light-emitting layer. Alternatively, when a light-emitting element has five light-emitting layers, four intermediate conductive layers are sandwiched in the light-emitting layer.

Specifically, a display device includes a transistor formed over a substrate, and a light-emitting element connected to the transistor through an interlayer insulating film. The light-emitting element has a structure in which a first electrode, a plurality of light-emitting layers, a plurality of intermediate conductive layers sandwiched by the plurality of light-emitting layers, a second electrode are stacked. The intermediate conductive layer includes an electron injecting layer and a hole injecting layer that is in contact with the electron injecting layer, and at least one of the electron injecting layer and the hole injecting layer is an island-like layer.

Further specifically, a display device according to the present invention includes a transistor formed over a substrate, and a light-emitting element connected to the transistor through an interlayer insulating film. The light emitting element is formed by sequentially stacking an n number of light-emitting layers (where n is an integer equal to or greater than 2) comprising a first through an n-th light-emitting layers between a first electrode and a second electrode, and an intermediate conductive layer is formed between a k-th light-emitting layer (where k is an integer of $1 \leq k \leq (n-1)$) and a (k+1)th light-emitting layer, where the intermediate conductive layer comprises an electron injecting layer and a hole-injecting layer that is in contact with the electron injecting layer, and at least one of the electron-injecting layer and the hole-injecting layer is an island-like layer. Here, the first electrode is a pixel electrode and the second electrode is an opposite electrode.

One feature of a light-emitting element according to the present invention is that in an EL element having a plurality of light-emitting layers between a pixel electrode and an opposite electrode, an intermediate conductive layer is provided between each light-emitting layer, and at least one of an electron-injecting layer and a hole-injecting layer constituting an intermediate conductive layer (at least one intermediate conductive layer in the case of forming plural intermediate conductive layers) is not film-like but island-like. By adopting the structure, the following effects can be obtained.

There is an advantageous effect that transparency of a material for the electron-injecting (or hole-injecting) layer of an intermediate conductive layer is not required to be considered. Even when using an intermediate conductive layer that has a large extinction coefficient in a visible band, absorption itself can become vanishingly small by forming the layer into island-like shape. Therefore, light from the light-emitting layer is mostly not absorbed into the intermediate conductive layer.

In addition, in case that an organic material (especially aromatic compound) is used as an intermediate conductive layer, the crystallinity of the intermediate conductive layer become high unless a molecular design is positively conducted thereto. Thus, characteristics of an element change drastically. At worst, electricity is conducted between the both electrodes, and the both electrodes are short-circuited. However, by adopting a structure according to the present invention, even if individual island-like layers are crystallized, the influence on the light-emitting element becomes small or can be ignored and the change of the light-emitting element characteristics due to crystallization can be suppressed.

Further, it is clear that the slight amount of material is needed to be used, and thus the manufacturing time of an element can be shortened, which results in reduction of cost. As described above, various effects can be obtained by forming a part of intermediate conductive layer to be island-like instead of to be film-like as conventionally.

Further, a display device according to the present invention has a light-emitting element that provides the above described operation effects; therefore various operation effects such as high light-extraction efficiency, low power-consumption, low cost and long life can be obtained.

BRIEF DESCRIPTION OF DRAWINGS

In the accompanying drawings:

FIGS. 4A and 4B are each a cross-sectional view of a display device according to the present invention;

BEST MODE FOR CARRYING OUT THE INVENTION

Figure 1:
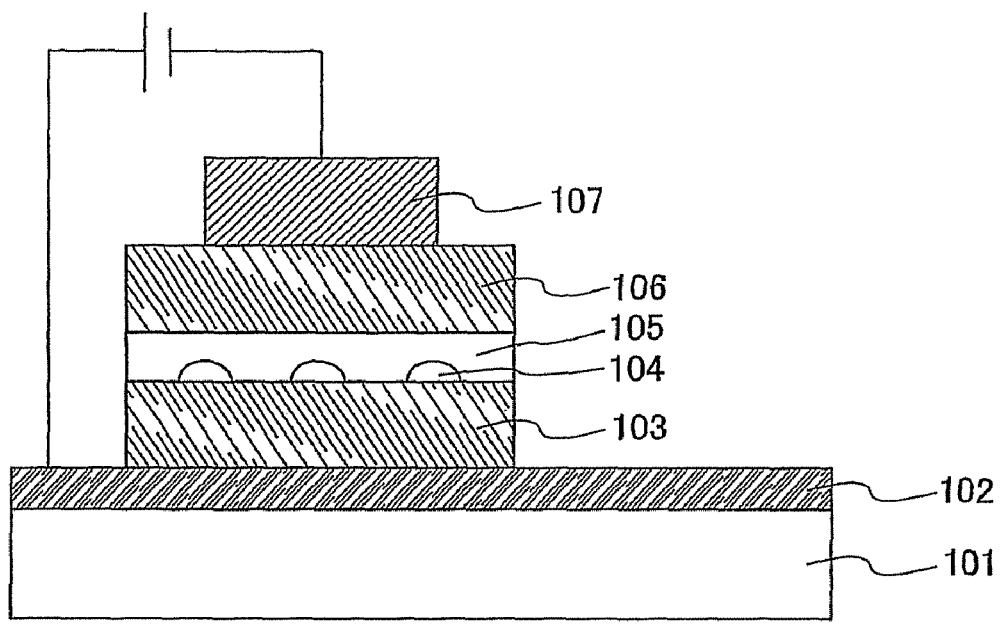
FIG. 1 shows a structure of a light-emitting element according to the present invention.

Embodiments according to the present invention will hereinafter be described with reference to the accompanying drawings. The present invention can be carried out in many different modes, and it is easily understood by those skilled in the art that modes and details herein disclosed can be modified in various ways without departing from the spirit and the scope of the present invention. It should be noted that the present invention should not be interpreted as being limited to the description of the embodiments to be given below. For example, characteristic parts of Embodiments and Examples to be described hereinafter can be combined and implemented. Note that the same reference numerals are used for the same portions in the structure of the present invention to be described hereinafter.

Embodiment of the present invention is described with reference to FIG. 1. Note that FIG. 1 shows an element structure in which two light-emitting layers are separated by one intermediate conductive layer; however, the number of light-emitting layers is not limited. In addition, by the structure, the number of the intermediate conductive layers is fewer than the total number of the light-emitting layers by one.

In an organic EL element, light is needed to be extracted outside, and thus at least one of an anode and a cathode is required to be transparent. Hereinafter, a light-emitting element in which over a substrate, a transparent anode is formed on the substrate side and light can be extracted from the anode side, namely a bottom-emission type light emitting element is described.

A substrate 101 for supporting a light-emitting element and the like is prepared. Paper, plastic resin and the like as well as quartz or glass can be used as the substrate 101. In addition, a substrate over which a thin film transistor (TFT) has been formed in advance can also be used. In this embodiment, since a transparent anode 102 is formed over the substrate and light is extracted to the substrate side, it is preferable that the substrate transmits visible light. As the transparent anode, a conductive metal oxide such as ITO or IZO is preferable. Such conductive metal oxide films are formed by a sputtering method in a conventional manner; however, may be formed by a sol-gel method. In addition, a metal having a high work function such as gold can also be used as a material other than the metal oxide. In this case, an ultra thin film is formed in consideration of a light-transmitting property.

A first light-emitting layer 103 is formed on the anode that has been formed in this manner. This light-emitting layer is formed primarily using an organic compound. The light-emitting layer may be formed using a thin film of a single composition. For example, typical metal complexes are given, such as tris(8-quinolinolate) aluminum ($Alq_3$), tris(4-methyl-8-quinolinolate) aluminum ($Almq_3$), bis(10-hydroxybenzo[h]-quinolinato) beryllium ($BeBq_2$), bis(2-methyl-8-quinolinolate)(4-phenylphenolate)aluminum (BAlq), bis[2-(2-hydroxyphenyl)-benzooxazolate]zinc ($Zn(BOX)_2$), and bis[2-(2-hydroxyphenyl)-benzothiazolate]zinc ($Zn(BTZ)_2$). Further, a compound containing hydrocarbon, such as 9,10-diphenylanthracene or 4,4'-bis(2,2-diphenyl ethenyl) biphenyl are also preferable.

Further, the light-emitting layer may be a mixed layer of a plurality of materials. Luminous efficiency can be increased by adding a slight amount of a fluorescent material or a phosphorus material into the above described light emitter. As the fluorescent material, a coumarin derivative, a quinacridon derivative, an acridone derivative, a pyrene derivative, a perylene derivative, an anthracene derivative, a pyrrone derivative and the like are cited. As the phosphorus material, triplet light-emitting materials such as tris (2-phenylpyridine) iridium (hereinafter, $Ir(ppy)_3$) and 2,3,7,8,12,13,17,18-octaethyl-21H,23H-porphyrin-platinum (hereafter, PtOEP), transition metal complexes of Ir, Ru, Ph, Pt or a rare earth metal or the like can be cited.

On the other hand, the light-emitting layer may be a film having a stacked structure. By adopting the stacked structure, injection balance of electrons and holes can be controlled more easily than by adopting the above-described light-emitting layer of a single composition or a mixed composition. Accordingly, the luminous efficiency can be more enhanced. For example, a hole-transporting layer for efficiently carrying injected holes into the light-emitting layer, and an electron-transporting layer for efficiently carrying injected electrons into the light-emitting layer are preferably provided in addition to the above-described light-emitting layer of a single composition or a mixed composition. In some cases in this specification, layers including such hole transporting layer, electron transporting layer or hole injecting layer and electron injecting layer in addition to a light-emitting layer is collectively referred to as a light-emitting layer. As materials suitable for the hole transporting layer, a compound comprising an aromatic amine (that is, one having a benzene ring-nitrogen bond therein) is preferred. As other widely-used materials, star burst aromatic amine compounds are also used, such as 4,4'-bis[N-(3-methylphenyl)-N-phenyl-amino]-biphenyl, derivatives thereof such as 4,4'-bis[N-(1-naphthyl)-N-phenyl-amino]-biphenyl,4,4',4"-tris[N,N-diphenyl-amino]triphenyl amine, and 4,4',4"-tris[N-(3-methylphenyl)-N-phenyl-amino]-triphenyl amine. The typical metal complexes are often used as materials suitable for the electron transporting layer. As other materials, triazole derivatives such as 3-(4-tert-butylphenyl)-4-(4-ethylphenyl)-5-(4-biphenylyl)-1,2,4-triazole and phenanthroline derivatives such as bathophenanthroline and bathocuproin, or benzoxazole derivatives such as bis(5-methylbenzoxazol-2-yl)stilbene may be also used.

A film formation method may be a wet method such as a spin coating method, a dip coating method, a spray method as well as vacuum vapor deposition.

Then, an intermediate conductive layer is formed. In this embodiment, since a light-emitting element is formed on the anode side, an electron-injecting layer 104 is formed first. Herein, the electron-injecting layer 104 may be formed to be island-like as shown in the drawing. It is preferable to employ e.g., a vapor deposition method to form the island-like electron-injecting layer. In this case, specifically, after a sublimated material forms a nucleus, the nucleus is grown. The vapor deposition process may be stopped before clusters grown from different nucleuses binds with one another. In addition, as materials suitable for the electron-injecting layer 104, metals having a low work function and metal compounds thereof are given. Mg—Ag alloy, Al—Li alloy, Mg—Li alloy, $Ca_3N_2$, $Mg_3N_2$ and the like are given as examples thereof. Further, an organic semiconductor doped with a donor is also an example, as well as such metals. As preferable examples of the organic semiconductor, a compound to serve as an acceptor is given, and an electron-transporting material that is often used in a light-emitting element may be adopted. For example, typical metal complexes typified by Alq, phenanthroline derivatives, triazine derivatives, oxazole derivatives, quinoline derivatives, quinoxaline derivatives and the like are given. Further, electron-accepting compounds such as tetracyano quinodimethane, tetracyanoethylene, and tetrachloroquinone are also preferable examples. Condensed aromatic hydrocarbon such as rubrene and perylene derivatives is nominated as other examples. Conductive materials such as graphite can also be employed. Further, conjugated polymer (high molecular weight compound) such as polyphenylene vinylene, polyphenylene ethynylene or polypyridine can also be used. Note that high molecular weight compound (polymer) is preferably used also for the light-emitting layer in this case. Further, it is preferable to design so that the high molecular weight compound used for the light-emitting layer is not dissolved in a solvent for dissolving a high molecular weight compound used for forming the intermediate conductive layer. This is made in order to prevent the thin-film structure from being broken as the result of dissolution of the light-emitting layer by the solvent for dissolving high molecular weight compound material, because the high molecular weight compound material is formed by a wet method in a conventional manner. Metals having a low work function such as alkali metal and alkaline earth metal are preferable for the donor added into the organic semiconductor. Electron excess type organic compounds such as tetrathiafulvalene may also be used. Note that it is essential that the acceptor property of such organic semiconductors is strong, because the donor property of the electron excess type organic compounds is smaller than that of alkali metals or alkaline earth metals. As other examples than organic semiconductors, alkali metals, alkaline earth metals, rare earth metals and compounds containing these metals are preferable. Specifically, calcium fluoride, lithium oxide, lithium chloride, lithium fluoride, magnesium fluoride, barium oxide are given.

In this way, the electron-injecting layer 104 that is film-like or island-like is formed on the first light-emitting layer 103. The electron-injecting layer 104 may be film-like or island-like; however, the island-like electron-injecting layer is more preferable than the film-like one, because light can be extracted more efficiently. By the island-like electron-injecting layer 104, defects of the light-emitting element due to crystallization are difficult to generate, even if a substance to easily be crystallized is used.

Figure 2A:
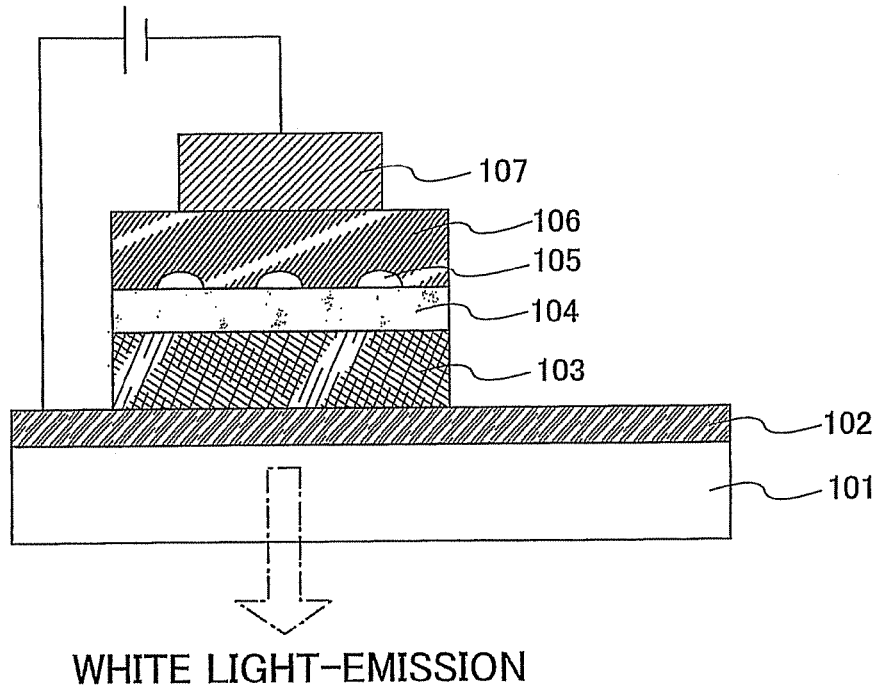
FIGS. 2A and 2B each show a structure of a light-emitting element according to the present invention.
Figure 2B:
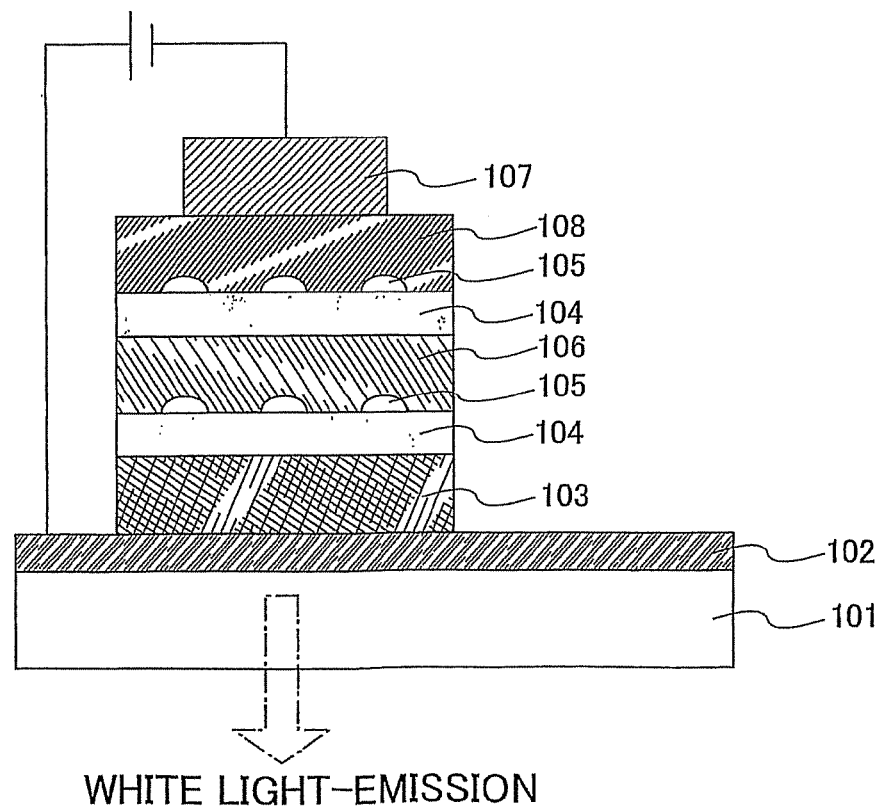

As the intermediate conductive layer, the electron-injecting layer 104 is formed first and then a hole-injecting layer 105 is formed. Metals such as gold, aluminum, platinum, copper, and nickel are given as materials suitable for the hole-injecting layer. The metals have a high work function, and thus holes can be easily injected. These materials can hold transparency only when they are ultra thin films. However, as proposed in the present invention, the electron-injecting layer of the intermediate conductive layer is formed to be film-like, and then the hole-injecting layer is formed to be island-like. As the result thereof, the intermediate conductive layer itself can hold transparency (FIG. 2A and FIG. 2B).

Various metal-containing compounds can be used as materials for forming the hole-injecting layer as other examples. For example, transition metal oxides such as cobalt oxide, titanium oxide, niobium oxide, nickel oxide, neodymium oxide, vanadium oxide, beryllium aluminum oxide, molybdenum oxide, lanthanum oxide, ruthenium oxide, rhenium oxide are given. Preferably, oxides, nitrides or halides of transition metal of 4 to 7 groups may be used. These metal oxides, nitrides, halides or the like conduct an electron transfer reaction at the interface with the light-emitting layer, and forms electric charges-transfer complex. Thus, the materials can inject holes by themselves. In addition, a suitable donor may be added into these materials to actively form electric charges-transfer complex. Electron excess type organic compounds such as tetrathiafulvalene or carbazole derivatives are given as the donor. In addition, aromatic amine group that is classified into, so-called, hole transporting materials and hole injecting materials of organic EL elements are also preferable. Specifically, TPD, NPB and the like are given.

The hole-injecting layer 105 may be film-like or island-like; however, light can be extracted more efficiently by adopting the island-like hole-injecting layer 105. By the island-like hole-injecting layer 105, defects of the light-emitting element due to crystallization are difficult to generate, even if a substance to easily be crystallized is used.

Note that when it is difficult to maintain transparency unless the electron-injecting layer of the intermediate conductive layer is an ultra thin film, the electron-injecting layer is formed to be island-like, and then the hole-injecting layer is formed to be film-like. As the result thereof, the intermediate conductive layer itself can hold transparency.

A second light-emitting layer 106 is formed on the thusly formed intermediate conductive layer. This light-emitting layer may have the same structure as the first light-emitting layer or a different structure. Moreover, color of light-emission may be the same or different. When the first light-emitting layer and the second light-emitting layer emit light of different colors that are complementary colors of each other, white light-emission can be obtained. For example, as shown in FIG. 2A, it may be designed that the first light-emitting layer 103 emits light of blue and the second light-emitting layer 106 emits light of red. Specifically, the first light-emitting layer is formed using aromatic hydrocarbon compounds typified by anthracene derivatives such as 9,10-diphenylanthracene or the like, whose luminescence center is observed in about 450 to 500 nm. The second light-emitting layer may be formed using materials using so-called DCM such as 4-(dicyanomethylene)-2-[p-(dimethylamino)styryl]-6-methyl-4H-pyran, aromatic hydrocarbon compound such as rubrene, or the like whose luminescence center is observed in about 600 to 650 nm. Alternatively, as shown in FIG. 2B, three organic thin films (a third light-emitting layer 108 is added to the first and second light-emitting layers) are formed and each of them are designed to emit primary colors of blue, green and red, thereby obtaining light-emission of white color similarly. Thus, it can be applied to lightning. As materials for emitting green light, a typical metal complex such as Alq, and fluorescent material such as quinacridon and coumarin are preferred. A phosphorescence material such as $Ir(ppy)_3$ can be also used.

A cathode 107 is formed on the second light-emitting layer 106 (or the third light-emitting layer 108). In this embodiment, since light is extracted from the anode side, the cathode may be non-transparent. Specifically, aluminum or a magnesium-silver alloy may be employed. Note that the electron-injecting layer may be provided before forming the cathode so as to promote electron-injection from the cathode. For the electron-injecting layer, alkali metal salt or alkaline earth metal salt such as calcium fluoride or lithium fluoride, lithium oxide or lithium chloride may be used.

Note that in this embodiment, the anode 102 and the cathode 107 may be counterchanged, and at this time correspondingly, the electron-injecting layer and the hole-injecting layer are preferably stacked reversely.

Figure 16:
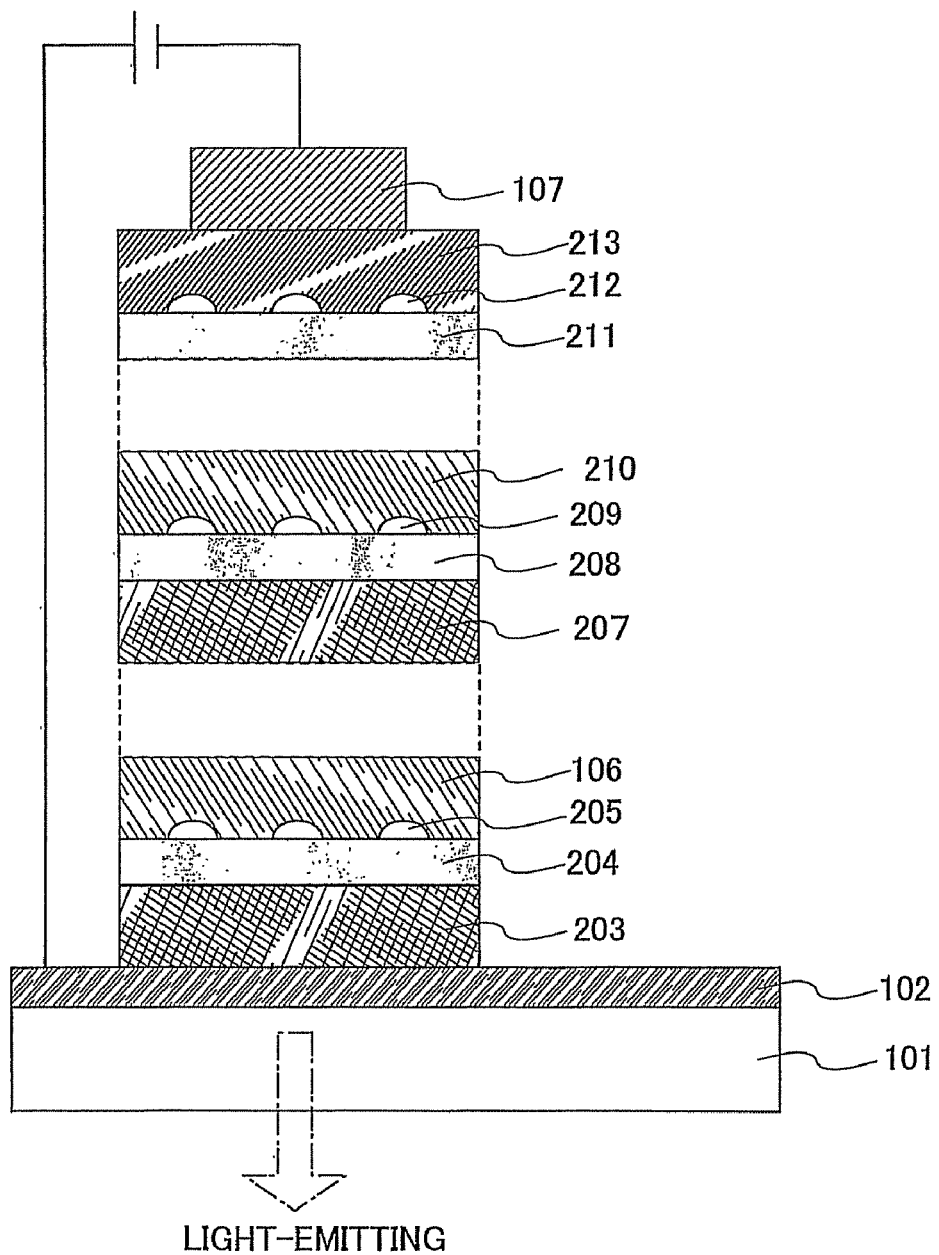
FIG. 16 shows a structure of a light-emitting element according to the present invention.

In addition, the number of the light-emitting layers and the intermediate conductive layers that are stacked is not limited in particular. Specifically, the light-emitting element includes a structure in which a first electrode, a plurality of light-emitting layers, a plurality of intermediate conductive layers sandwiched by the plurality of light-emitting layers, a second electrode are stacked. The intermediate conductive layer includes an electron injecting layer and a hole injecting layer that is in contact with the electron injecting layer, and at least one of the electron injecting layer and the hole injecting layer is an island-like layer. As shown in FIG. 16, for example, the light emitting element is formed by sequentially stacking an n number of light-emitting layers (where n is an integer equal to or greater than 2) comprising a first light-emitting layer 203 through an n-th light-emitting layer 213 between the anode 102 and the cathode 107. Then, a first electron injecting layer 204 and a first hole-injecting layer 205 through a (n−1)th electron injecting layer 211 and a (n−1)th hole-injecting layer 212 are formed between the light-emitting layers. That is, the intermediate conductive layer is formed between a k-th light-emitting layer 207 (where k is an integer of $1 \leq k \leq (n-1)$) and a (k+1)th light-emitting layer 210. The intermediate conductive layer comprises a k-th electron injecting layer 208 and a k-th hole-injecting layer 209 that is in contact with the electron injecting layer 208. According to this embodiment of the invention, the k-th hole-injecting layer 209 is an island-like layer.

EXAMPLE 1

Figure 3A:
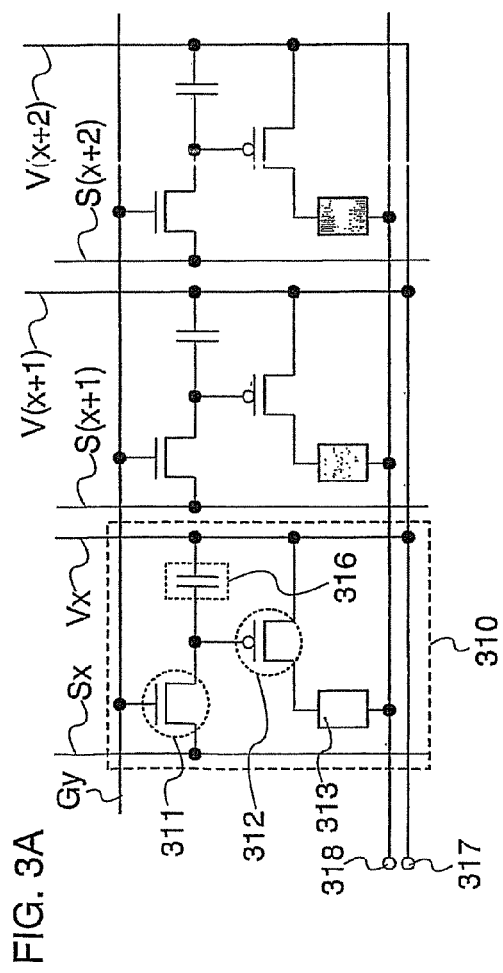
FIGS. 3A and 3B are an equivalent circuit diagram (of two transistors) of a pixel region in a display device according to the present invention and a top view of a display panel of the display device, respectively.

In this example, the structure of an active matrix display device (also referred to as an active matrix light-emitting device) using a light-emitting element according to Embodiment is explained with reference to FIGS. 3A, 3B 4A and 4B. A display device according to this example has a plurality of pixels 310 including a plurality of elements in a region formed by the intersection of a source line Sx (x is a natural number, $1 \leq x \leq m$) with a gate line Gy (y is a natural number, $1 \leq x \leq n$) with an insulator interposed therebetween (FIG. 3A). The pixel 310 has a light-emitting element 313, a capacitor element 316 and two transistors. One of the two transistors is a transistor for switching 311 (switching transistor) for controlling input of a video signal to the pixel 310, and the other is a transistor for driving 312 (driving transistor) for controlling light emission and non-light emission of the light-emitting element 313. The capacitor element 316 serves to hold gate-source voltage of the transistor 312.

Agate electrode of the transistor 311 is connected to the gate line Gy. One of a source electrode and a drain electrode is connected to the source line Sx, and the other is connected to a gate electrode of the transistor 312. One of a source electrode and a drain electrode of the transistor 312 is connected to a first power source 317 via a power source line Vx (x is a natural number, $1 \leq x \leq 1$), and the other is connected to a pixel electrode of the light-emitting element 313. An opposite electrode (cathode 107) of the light-emitting element 313 is connected to a second power source 318. The capacitor element 316 is provided between the gate electrode and the source electrode of the transistor 312. The transistors 311 and 312 may have an n-type conductivity or a p-type conductivity. In the structure shown in the drawing, the transistor 311 is an n-channel type and the transistor 312 is a p-channel type. The electric potentials of the first power source 317 and the second power source 318 are not especially restricted. The first power source 317 and the second power source 318 are set to have electric potentials different from each other so that forward bias voltage or reverse bias voltage is applied to the light-emitting element 313.

A semiconductor constituting parts of the transistors 311 and 312 may be an amorphous semiconductor (amorphous silicon), a microcrystalline semiconductor, a crystalline semiconductor, an organic semiconductor, or the like. The microcrystnlline semiconductor may be formed using silane gas ($SiH_4$) and fluorine gas ($F_2$), or silane gas ($SiH_4$) and hydrogen gas. Alternatively, the microcrystalline semiconductor may be formed by forming a thin film using such a gas and irradiating the thin film with laser light. The gate electrodes of the transistors 311 and 312 are formed as a single layer or a stacked layer of a conductive material. For instance, the stacked layer is preferably formed to have any one of the following structures: a stacked layer structure formed by stacking tungsten (W) over tungsten nitride (WN), a stacked layer structure formed by stacking aluminum (Al) and molybdenum (Mo) over Mo, and a stacked layer structure formed by stacking Mo over molybdenum nitride (MoN).

Figure 3B:
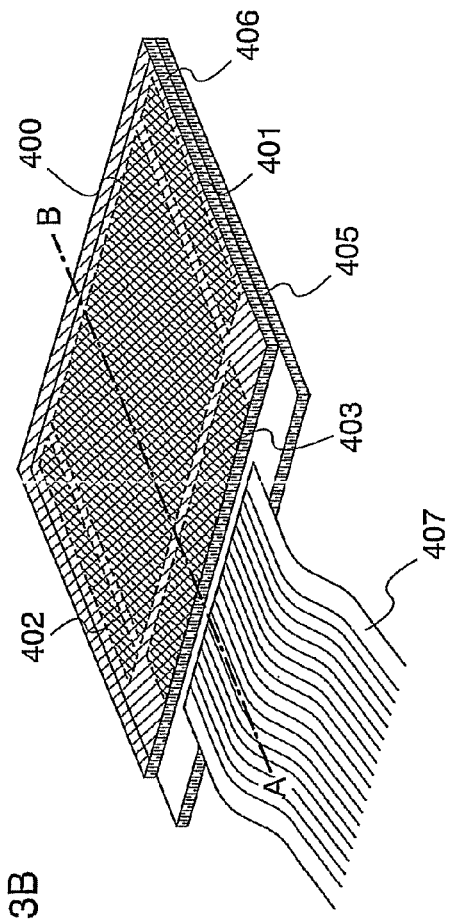

FIG. 3B is a top view of a display panel of a display device according to this example. In FIG. 3B, a light-emitting region 400 having a plurality of pixels (pixels 310 shown in FIG. 3A) including light-emitting elements (also, herein referred to as a pixel region or a display region), gate drivers 401 and 402, a source driver 403, and a connection film 407 such as an FPC are formed over a substrate 405. The connection film 407 is connected to an IC chip or the like.

FIGS. 4A and 4B are cross-sectional views of a display panel taken along the line A-B in FIG. 3B. FIG. 4A shows a light-emitting region 400 of a top emission light-emitting device to which a light-emitting element according to the present invention is applied, whereas FIG. 4B shows a light-emitting region 400 of a dual emission light-emitting device to which a light-emitting element according to the present invention is applied. In the dual emission light-emitting device, light can be extracted from the opposite sides (top side and bottom side).

The structure shown in FIG. 4A is described first. In FIG. 4A, the transistor 312 and the light-emitting element 313 provided in the light-emitting region 400 (the transistor 311 in FIG. 3A is omitted here), and an element group 410 provided in the source driver 403 are shown. Reference numeral 316 denotes a capacitor element. A sealing agent 408 is provided around the periphery of the light-emitting region 400, the gate drivers 401 and 402, and the source driver 403. Thus, the light-emitting element 313 is sealed by the sealing agent 408 and an opposite substrate 406. The sealing process is a process for protecting the light-emitting element 313 from water, and a cover material (such as glass, ceramic, plastic or metal) is used for the sealing process. Alternatively, thermosetting resin or ultraviolet curing resin may be used in the sealing process, further a thin film having high barrier property such as a metal oxide or nitride may be used.

As for the sealing agent 408, ultraviolet curing or thermosetting epoxy resin may be used, typically. An ultraviolet epoxy resin (2500 Clear manufactured by ElectroLite Corporation) having high heat resistance, a refractive index of 1.50, a viscosity of 500 cps, a shore D hardness of 90, a tensile intensity of 3000 psi, a Tg point of 150° C., a volume resistance of $1 \times 10^{15}$ Ω·cm, and a resistance voltage of 450 V/mil is used here.

The cathode 107 of the light-emitting element 313 is connected to the second power source 318 in FIG. 3A. An element formed over the substrate 405 is preferably made from a crystalline semiconductor (polysilicon) having better characteristics such as mobility than that of an amorphous semiconductor. In this instance, a monolithic device in which elements are formed on the same surface can be obtained. A panel having the foregoing structure can be reduced in its size, weight, and thickness because the number of external ICs to be connected is reduced.

The light-emitting region 400 may include a transistor having an amorphous semiconductor (amorphous silicon) formed over an insulating surface as a channel portion. The gate drivers 401 and 402 and the source driver 403 may include IC chips. The IC chips may be attached onto the substrate 405 by a COG method or attached onto the connection film 407 to be connected to the substrate 405. The amorphous semiconductor can be readily formed by using a CVD method over a large substrate. Further, a panel can be provided at low cost because a process of crystallization is not required. When a conductive layer is formed by a droplet discharging method typified by an ink-jet method, the panel can be provided at much lower cost.

In the structure shown in FIG. 4A, first and second interlayer insulating films 411 and 412 are formed over the transistor 312 and the element group 410. Further, a wiring 414 is formed through an opening portion that is provided in the first and second interlayer insulating films 411 and 412. The wiring 414 serves as a source wiring, a drain wiring or the like of the transistor 312 and the element group 410. It is preferable to use an alloy containing aluminum and nickel as the wiring 414. The alloy may contain carbon, cobalt, iron, silicon, or the like. The alloy is preferably mixed, for example, with carbon of 0.1 to 3.0 atomic % at rate of content, at least one element of nickel, cobalt, iron of 0.5 to 7.0 atomic %, and silicon of 0.5 to 2.0 atomic %. These materials have a characteristic of having a low resistance value of 3.0 to 5.0 Ωcm.

In the case that Al is used as the wiring 414, there is a problem of generating corrosion with an anode 102, for example, ITO. Despite of the problem, favorable contact to ITO can be obtained by adopting a stacked layer structure of sandwiching the Al (or Al—Si alloy) between Ti or between TiN. For example, a stacked layer structure of sequentially stacking Ti, Al, and Ti may be formed. On the other hand, the foregoing Al—C alloy, Al—C—Ni alloy, or the like has oxidation-reduction potential that is substantially equal to that of a transparent conductive film such as ITO; therefore the Al—C alloy or the Al—C—Ni alloy can make direct contact to ITO or the like without having a stacked layer structure (without being sandwiched between Ti, TiN, or the like). The wiring 414 can be formed using a target material of the foregoing alloys by a sputtering method. When etching is performed to the alloys using resist as a mask, a wet etching method is preferably used, and at this time phosphoric acid or the like can be used as an etchant. The wiring connected to the second power source 318 can also be formed in the same manner as that of the wiring 414.

The anode 102 is formed to be in contact with the wiring 414. Note that the order of stacking the wiring 414 and the anode 102 is not limited thereto. A reflective conductive film is used as the anode 102 because the light-emitting device shown in FIG. 4A is a top emission type. For example, a film including an element selected from Cr, Ti, TiN, TiSixNy, Ni, W, WSix, WNx, WSixNy, NbN, Pt, Zn, Sn, In, and Mo, of an alloy material or a compound material containing the element as the main component or a stacked layer of there films may be used.

In FIG. 4A, the anode 102 extends as far as the region where the capacitor element 316 is formed and the anode 102 serves also as a capacitor electrode of the capacitor element 316. Of course, a wiring to function as a capacitor electrode may be formed separately (in general, it is formed at the same time as the wiring 414).

The materials of the first and second interlayer insulating films are not especially restricted. For instance, the first interlayer insulating film may be made from an inorganic material, and the second interlayer insulating film may be made from an organic material, and at this time silicon oxide, silicon nitride, silicon oxynitride, a film including carbon such as DLC or carbon nitride (CN), PSG (phosphorus glass), BPSG (boron phosphorus glass), an alumina film; or the like can be used as the inorganic material. As for the formation method, a plasma CVD method, a low pressure CVD (LPCVD) method, an atmospheric plasma method, or the like can be used. Alternatively, an SOG film (for example, a SiOx film including an alkyl group) formed by a coating method can be used. In this example, the first interlayer insulating film 411 formed over the transistor 312 is formed as far as possible, because the first interlayer insulating film 411 has a barrier function to prevent impurities such as Na, $O_2$ and water from entering the transistor 312 (which is referred to as a cap insulating film, since it has the function). However, it is possible that the first interlayer insulating film is omitted.

A photosensitive or non photosensitive organic material such as polyimide, acrylic, polyamide, resist materials, or benzocyclobutene; or heat-resisting organic resin such as siloxane can be used as the organic material. As the method for forming the interlayer insulating films, a spin coating method, a dipping method, a spray coating method, a droplet discharging method (such as an ink-jet method, a screen printing method, an offset printing method), a doctor knife, a roll coater, a curtain coater, a knife coater, or the like can be used depending on the materials. The first and second interlayer insulating films can be formed by stacking the foregoing materials.

A bank layer 409 (also referred to as mound, bank or barrier) is formed around the periphery of the anode 102. As the bank layer 409, a photosensitive or non photosensitive organic resin material such as polyimide, acrylic, polyamide, polyimide amide, resist materials, or benzocyclobutene; or heat-resisting organic resin such as siloxane; inorganic insulating material (SiN, SiO, SiON, SiNO, or the like); or a stacked layer formed by the foregoing materials can be used. Herein, photosensitive organic resin covered by a silicon nitride film is used. As the foregoing insulator, any of a negative type photosensitive resin that becomes insoluble to etchant by light and a positive type photosensitive resin that becomes dissoluble to etchant by light can be used.

The shape of a side face of the bank layer 409 is not especially restricted. The bank layer 409 has preferably an S shape as shown in FIGS. 4A, 4B and the like. In other words, the bank layer 409 has preferably an inflection point at the side face of the bank layer 409. Accordingly, the coverage of a first light-emitting layer 103, an intermediate conductive layer (an electron-injecting layer 104 and a hole-injecting layer 105), a second light-emitting layer 106, the cathode 107 and the like that are formed over the pixel electrode (the anode 102) can be improved. Note that the insulator may be formed to have a curved upper edge portion having a radius of curvature, without being limited to the above described shape.

The first light-emitting layer 103, the intermediate conductive layer (the electron-injecting layer 104 and the hole-injecting layer 105), the second light-emitting layer 106, the cathode 107 and the like are formed over the anode 102 according to Embodiment described above. Note that a passivation film for blocking impurities such as water and oxygen into the light-emitting layer and the like, a layer for relaxing stress to the passivation film, a low refractive index layer having a low refractive index of air and the like may be formed over the cathode.

The light-emitting element according to the present invention is a top emission type which emits light through the cathode 107. An aluminum film having a thickness of 1 to 10 nm or an aluminum film slightly containing Li may be used for the cathode 107. When using an aluminum film as the cathode 107, a material except an oxide can be used as a material being in contact with the second light-emitting layer 106, and thus the reliability of a light-emitting device can be improved. Before forming the aluminum film having a thickness of 1 to 10 nm, a layer having a light-transmitting property (thickness of 1 to 5 nm) made from $CaF_2$, $MgF_2$, or $BaF_2$ may be formed as a cathode buffer layer. In order to reduce the resistance of the cathode 107, the cathode 107 may be formed to have a stacked layer structure of a thin metal film having a thickness of 1 to 10 nm and a transparent conductive film (ITO, indium oxide-zinc oxide alloy ($In_2O_3$—ZnO), zinc oxide (ZnO), or the like). Alternatively, in order to reduce the resistance of the cathode, an auxiliary electrode may be provided over the cathode 107 in a region that does not become a light-emitting region. The cathode may be formed selectively by using a resistance heating method by vapor deposition using an evaporation mask.

In the structure of FIG. 4A, the wiring 414 is formed through the opening portion formed in the second interlayer insulating film 412 and connected to the anode 102. However, a third interlayer insulating film and the anode 102 may be formed over the second interlayer insulating film 412, and the wiring 412 may be connected to the anode 102 through an opening portion formed in the third interlayer insulating film. The third interlayer insulating film may be formed in the same manner as the second interlayer insulating film. In this case, the structure can be designed more freely without any limitation on a region for forming the light-emitting element 313 due to a region for forming the transistor 312 or the wiring 414. Accordingly, a display device having a desired aperture ratio can be easily obtained.

The position where a connection film 407 is to be provided is not limited to that shown in FIG. 4A, and for example, the connection film 407 may be formed to be directly connected to the wiring 414 over the second interlayer insulating film 412. In addition, a space 418 may be filled with resin or the like.

A structure shown in FIG. 4B is described hereinafter. FIG. 4B shows a light-emitting region 400 of a dual emission light-emitting device to which a light-emitting element according to the present invention is applied. In FIG. 4B, light-emitting elements 313 corresponding to R, Q and B are provided. The light-emitting layers corresponding to R, G, and B can be formed according to Embodiment described above.

Moreover, since the light-emitting device shown in FIG. 4B is a dual-emission type, the anode 102 and the cathode 107 are required to transmit light. Therefore, ITO is typically used for the anode 102. Instead of ITO, a transparent conductive film such as ITSO (indium tin silicon oxide) which is a mixture of ITO and silicon oxide), ZnO (zinc oxide), GZO (gallium-doped zinc oxide), or IZO (indium zinc oxide) which is a mixture of indium oxide and zinc oxide of approximately 1 to 20%) can be used.

On the other hand, a transparent conductive film formed by co-evaporation of an element such as Al, AlLi, MgAg, MgIn, Ca, or an element belonging to 1 or 2 group in the periodic table and aluminum can be used as the cathode 107. These materials are suitable for a cathode material because they have low work functions and electrons are easily extracted therefrom. Note that the materials are required to be ultra thin so as to transmit light. A transparent conductive film such as ITO can be used as the cathode 107; however, a transparent conductive film itself cannot function as the cathode. Thus, a thin film of Li or the like is preferably formed between the ITO and the second light-emitting layer 106.

The first light emitting layer 103, the intermediate conductive layer (in other words, the electron-injecting layer 104 and the hole-injecting layer 105), the second light emitting layer 106, the cathode 107 and the like are formed over the anode 102 according to Embodiment described above. Note that a passivation film for blocking impurities such as water and oxygen into the light-emitting layer and the like, a layer for relaxing stress to the passivation film, a low refractive index layer having a low refractive index of air and the like may be formed over the cathode.

The present invention shown in FIG. 4B has a structure in which, as the whole or a portion of the second interlayer insulating film and the bank layer, an interlayer insulating film 417 having a light-shielding property (hereinafter, a light-shielding interlayer insulating film) and a bank layer 416 having a light-shielding property (hereinafter, a light-shielding bank layer) formed by adding carbon or metal particles to an organic material such as acrylic, polyimide, or siloxane, are used. An opening portion for transmitting light from the light-emitting layer is provided in the light-shielding interlayer insulating film 417, and the opening portion is filled with a light-transmitting resin 415 such as acrylic, polyimide, or siloxane.

The light-shielding interlayer insulating film 417 and the light-shielding bank layer 416 are formed in such a way that carbon and metal particles having a light-shielding property are added to an organic material such as acrylic, polyimide, or siloxane, and the material is agitated by using a shaker or an ultrasonic shaker, then, the agitated material is filtrated when needed, and then is spin-coated. When adding carbon particles or metal particles to an organic material, a surface active agent, a dispersing agent, or the like may be added to the organic material in order that these particles are mixed uniformly. In the case that the carbon particles are added, the amount of the added carbon particles may be controlled so that the concentration of the carbon particles is 5 to 15 atomic % by weight. Further, the thin film formed by a spin coating itself without change can be used. However, the thin film may be baked to be hardened. The transmittance and reflectance of the formed thin film each are 0% or approximately 0%.

The materials and structures of the first interlayer insulating film 411, the wiring 414 and the like are based on the structure of the present invention shown in FIG. 4A. In addition, a third interlayer insulating film may be formed separately over the second interlayer insulating film so that the whole or a portion thereof shields light.

In the dual-emission display device shown in FIG. 4B, a light-shielding interlayer insulating film 417 and a light-shielding bank layer 416 are provided, thereby preventing outlines of pixels from becoming blur (not-cleared) due to unnecessary light from the light-emitting layer (including light produced as the result of reflection of light emitted downward). In other words, the light-shielding insulating film absorbs unnecessary light, and thus the outlines of the pixels are clear and an image with high-quality can be displayed. Moreover, since the influence of the unnecessary light can be suppressed by arranging the light-shielding film, a polarizing plate is not needed and reduction in size, weight and thickness can be achieved. Moreover, the unnecessary light can be prevented from being leaked into, in particular, a region of a pixel where transistors are formed, and active matrix drive can be conducted with high-reliable transistors.

In FIGS. 4A and 4B, as described in Embodiment, when the light emitted from the light-emitting element 313 is light of white, color filters for R, G and B are provided in each pixel portion of the display device, thereby obtaining a full-color display device. The color filters can be formed using a known material and by a known method. In the dual-emission light-emitting device, the opening portion provided in the second interlayer insulating film 412 (or a light-shielding interlayer insulating film 417) is filled with light-transmitting resin including the coloring pigments of red, green and blue, and thus a color filter of a lower side (or a film serving as a color filter) is formed. It is preferable that the resin including coloring pigment is selectively formed by a droplet-discharging method. Further, a color filter of an upper side corresponding to the color filter of the lower side is formed using a known material on the opposite substrate side by a known method (not shown).

In general, when a color filter is formed, a black matrix (a lattice- or stripe-like light-shielding film for optically separating pixels of R, G and B) is formed in the periphery thereof. However, in the present invention according to the structure in FIG. 4B, the light-shielding bank layer 416 or the light-shielding interlayer insulating film 417 is formed in a portion where light is to be shielded, instead of using the black matrix. Therefore, manufacturing yields are improved since alignment can be more readily carried out, and the cost can be more reduced since an extra process is not required, as compared with the case of forming a black matrix separately.

In this example, the display panel can exert such effects of preventing adverse effects due to unnecessary light from a light-emitting layer, if at least either of the light-shielding interlayer insulating film 417 and the light-shielding bank layer 416 is formed. Needless to say, it is desirable that both the light-shielding interlayer insulating film 417 and the light-shielding bank layer 416 are formed. Characteristic points in the present invention related to FIGS. 4A and 4B can be replaced or combined with each other and implemented.

In this example, a structure in which the anode 102 and the cathode 107 are counterchanged may be adopted. In this case, the polarity of the transistor 312 connected to the cathode 107 may be reverse. This example can be freely combined with Embodiment and other Examples.

EXAMPLE 2

Figure 5A:
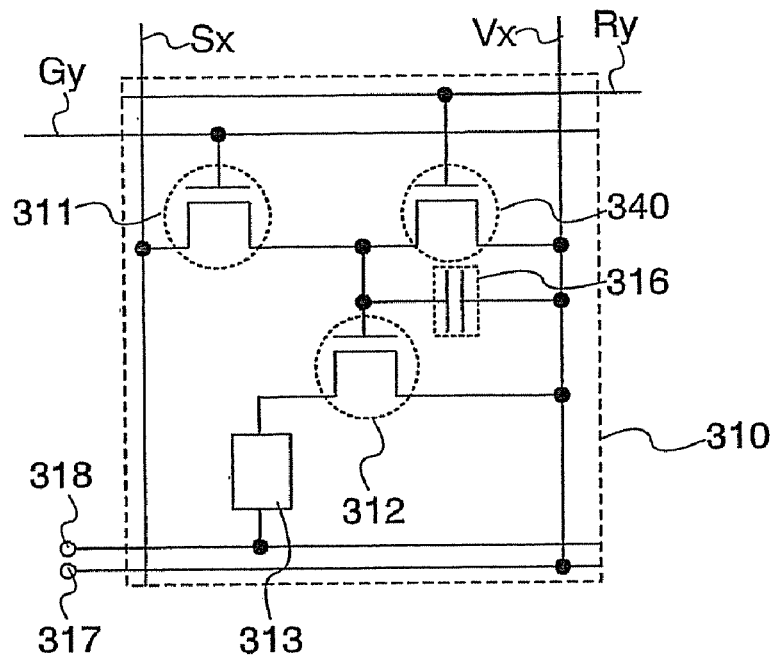
FIGS. 5A and 5B are each an equivalent circuit diagram (of three transistors and of four transistors) of a pixel region in a display device according to the present invention.

In this example, an example of a pixel circuit that can be applied to the present invention except the pixel circuit shown in FIG. 3A is explained with reference to FIGS. 5A and 5B. FIG. 5A shows a pixel circuit having a structure in which a transistor 340 for erasing and a gate wiring Ry for erasing are added to the pixel 310 that is shown in FIG. 3A. Since current does not flow to the light-emitting element 313 forcibly by the arrangement of the transistor 340, a lightning period can be started simultaneously with or immediately after starting a writing period without waiting for writing signals into all of pixels 310. Therefore, a duty ratio is improved, and thus a moving image can be especially displayed so well.

Figure 5B:
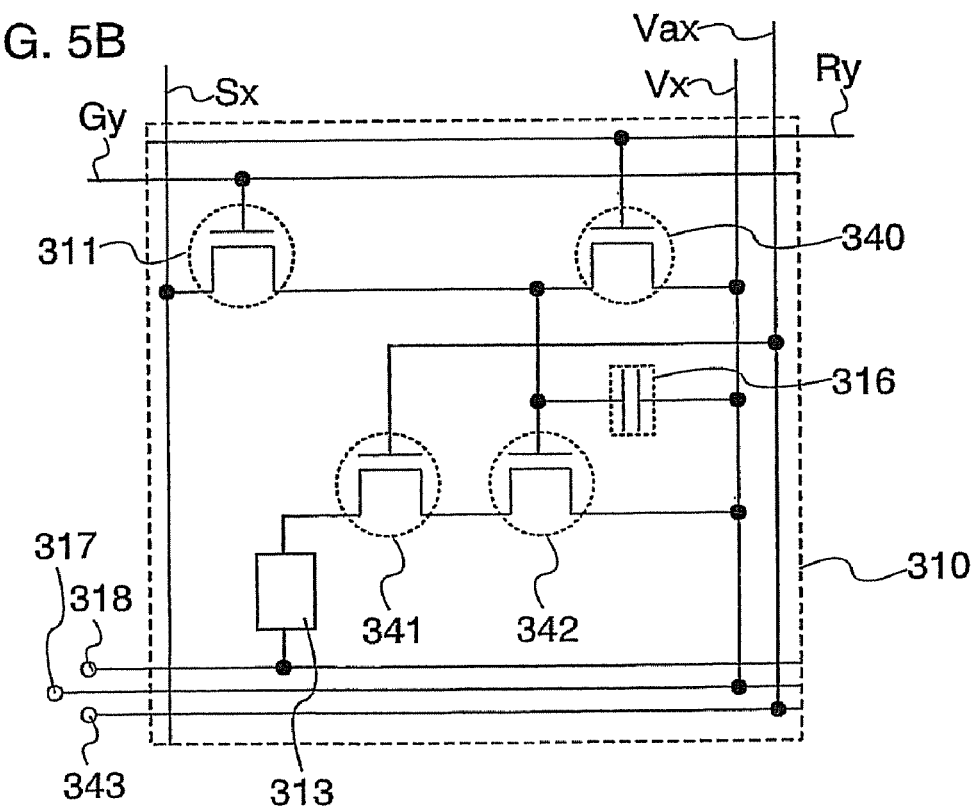

FIG. 5B shows a pixel circuit in which a transistor 312 of the pixel 310 shown in FIG. 3A is omitted and transistors 341, 342, and a power source line Vax (x is a natural number, $1 \leq x \leq 1$) are provided anew. The power source line Vax is connected to a power source 343. In this structure, the potential of a gate electrode of the transistor 341 is fixed and the transistor 341 is operated in a saturation region by connecting the gate electrode of the transistor 341 to the power source line Vax that is kept at constant potential. Further, the transistor 342 is operated in a linear region and a video signal including information of lighting and non-lighting of a pixel is inputted to the gate electrode of the transistor 342. Since the value of source-drain voltage of the transistor 342 operating in the linear region is small, slight variation of the gate-source voltage of the transistor 342 does not influence the current value of the light-emitting element 313. Therefore, the value of current flowing through the light-emitting element 313 is determined depending on the transistor 341 operating in the saturation region. The present invention having the foregoing configuration can improve luminance variation of the light-emitting element 313 due to characteristic variation of the transistor 341 to improve image quality. This example can be freely combined with Embodiment and other examples.

EXAMPLE 3

In this example, stacked layer structures of the wiring 414 (including a second power source 318 through this example) and the pixel electrode (anode or cathode) in the foregoing example are explained with reference to FIGS. 6A to 6D. FIGS. 6A to 6D each show only a part of a light-emitting element of a pixel region. In the FIGS. 6A to 6D, a second light-emitting layer, an intermediate conductive layer and the like are not shown.

Figure 6A:
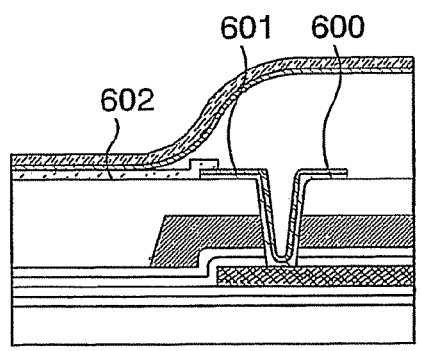
FIGS. 6A to 6D each show a structure in which a wiring has a stacked structure.

FIG. 6A shows the case that the wiring is formed to have a stacked layer structure of Mo 600 and an alloy containing aluminum 601 and the pixel electrode (e.g., anode 102 through this example) is formed using ITO 602. As the alloy containing aluminum 601, aluminum containing carbon, nickel, cobalt, iron, silicon, or the like is preferably used. It is preferable that the rate of content of carbon is preferably 0.1 to 3.0 atomic %; at least one kind of nickel, cobalt, and iron, 0.5 to 7.0 atomic %; and silicon, 0.5 to 2.0 atomic %. The material has one characteristic of having low resistance of 3.0 to 5.0 Ωcm. Here, the Mo 600 serves as a barrier metal.

In the case that at least one kind of nickel, cobalt, and iron is contained in the alloy 601 containing aluminum at 0.5% or more, potential of the alloy 601 can be made almost equal to electrode potential of the ITO 602, and thus the alloy can make directly contact to the ITO 602. Further, heat resistance of the alloy containing aluminum 601 is increased. By setting the rate of content of carbon 0.1% or more, occurrence of hillock can be prevented. There is an advantage that hillock is also prevented by mixing silicon into the alloy 601 or heating the alloy 601 at high temperature.

Figure 6B:
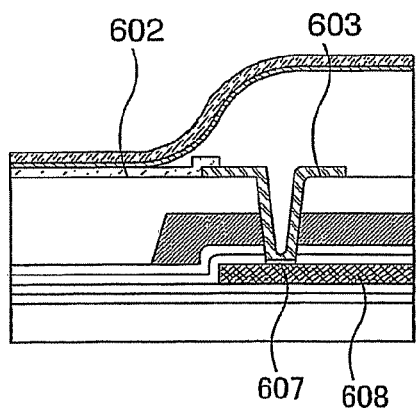

In FIG. 6B, an alloy containing aluminum 603 is used as a wiring and ITO 602 is used as a pixel electrode. Here, the alloy containing aluminum 603 contains at least nickel. After forming the alloy containing aluminum 603, nickel contained in the alloy seeps out to react chemically with silicon of a silicon semiconductor layer 608 of an active element (e.g., a TFT) for driving the pixel region. Thus, a nickel silicide 607 is formed. Therefore, there is an advantage of improving a conjugative property by the nickel silicide.

Figure 6C:
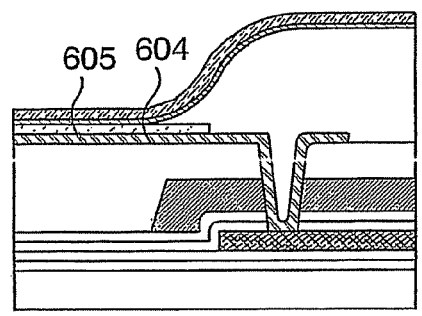

In FIG. 6C, an alloy containing aluminum 604 as a wiring and ITO 605 as a pixel electrode are stacked. It can be experimentally found that flatness is drastically improved especially in the case of a stacked layer structure of the alloy 604 containing aluminum and the ITO 605 is adopted. For example, the flatness thereof is twice as favorable as that of a stacked layer structure of a wiring formed by stacking TiN over an Al—Si alloy and ITO, and a stacked layer structure of a wiring formed by stacking TiN over an Al—Si alloy and ITSO.

Figure 6D:
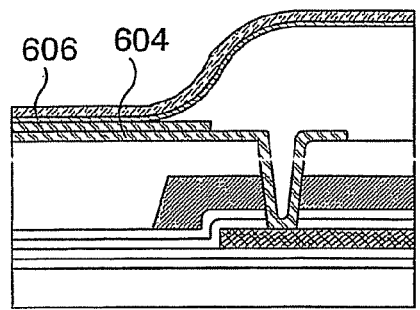

In FIG. 6D, an alloy containing aluminum 604 and an alloy containing aluminum 606 are used as a wiring and a pixel electrode, respectively.

Since the alloy containing aluminum can be easily pattern-formed by a wet etching method, the alloy containing aluminum can be widely used without being limited to a wiring or a pixel electrode. The alloy containing aluminum has high reflectivity, and thus it is preferably used in a top emission display device. In the case of a bottom emission or dual emission display device, the wiring or the pixel electrode is required to be formed as a thin film so as to transmit light therethrough. This example can be freely combined with Embodiment or other examples.

EXAMPLE 4

As an electronic device using a display device including a pixel region having a light-emitting element according to the present invention, a television device (TV, TV receiver), a camera such as a digital camera or a digital video camera, a portable phone device (such as a cellular phone), a portable information terminal such as a personal digital assistant (PDA), a portable game machine, a monitor, a computer, a sound playback device such as a car audio, an image playback device having a recording medium such as a domestic game machine, and the like can be nominated. Specific examples thereof are explained with reference to FIGS. 7A to 7F.

Figure 7A:
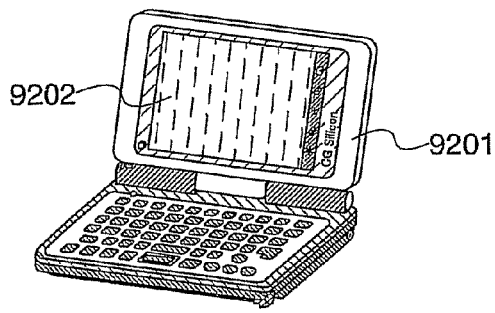
FIGS. 7A to 7F each show an electronic device provided with a display device according to the present invention.
Figure 7B:
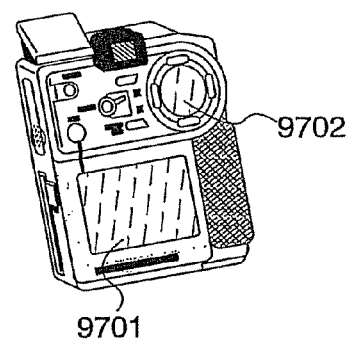
Figure 7C:
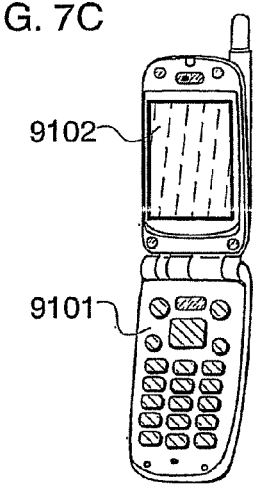
Figure 7D:
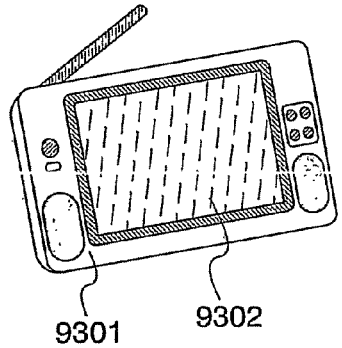
Figure 7E:
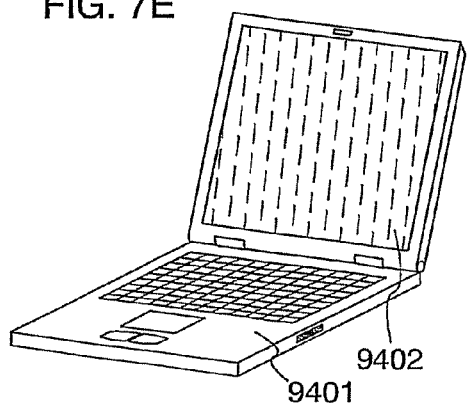

A portable information terminal using a display device according to the present invention shown in FIG. 7A includes a main body 9201, a display portion 9202 and the like, and can display a high resolution image according to the present invention. A digital camera using a display device according to the present invention shown in FIG. 7B includes display portions 9701, 9702 and the like, and can display a high resolution image according to the present invention. A portable terminal using a display device according to the present invention shown in FIG. 7C includes a main body 9101, a display portion 9102 and the like, and can display a high resolution image according to the present invention. A portable television device using a display device according to the present invention shown in FIG. 7D includes a main body 9301, a display portion 9302, and the like and can display a high resolution image according to the present invention. A laptop personal computer using a display device according to the present invention shown in FIG. 7E includes a main body 9401, a display portion 9402 and the like, and can display a high resolution image according to the present invention. A television device using a display device according to the present invention shown in FIG. 7F includes a main body 9501, a display portion 9502 and the like, and can display a high resolution image according to the present invention. In the case that an interlayer insulating film having a light-shielding property or a bank layer having a light-shielding property is provided as in the above examples, an influence due to unnecessary light can be suppressed, and thus a polarizing plate is not required, which results in reduction of the size, the weight, and the thickness.

Figure 8:
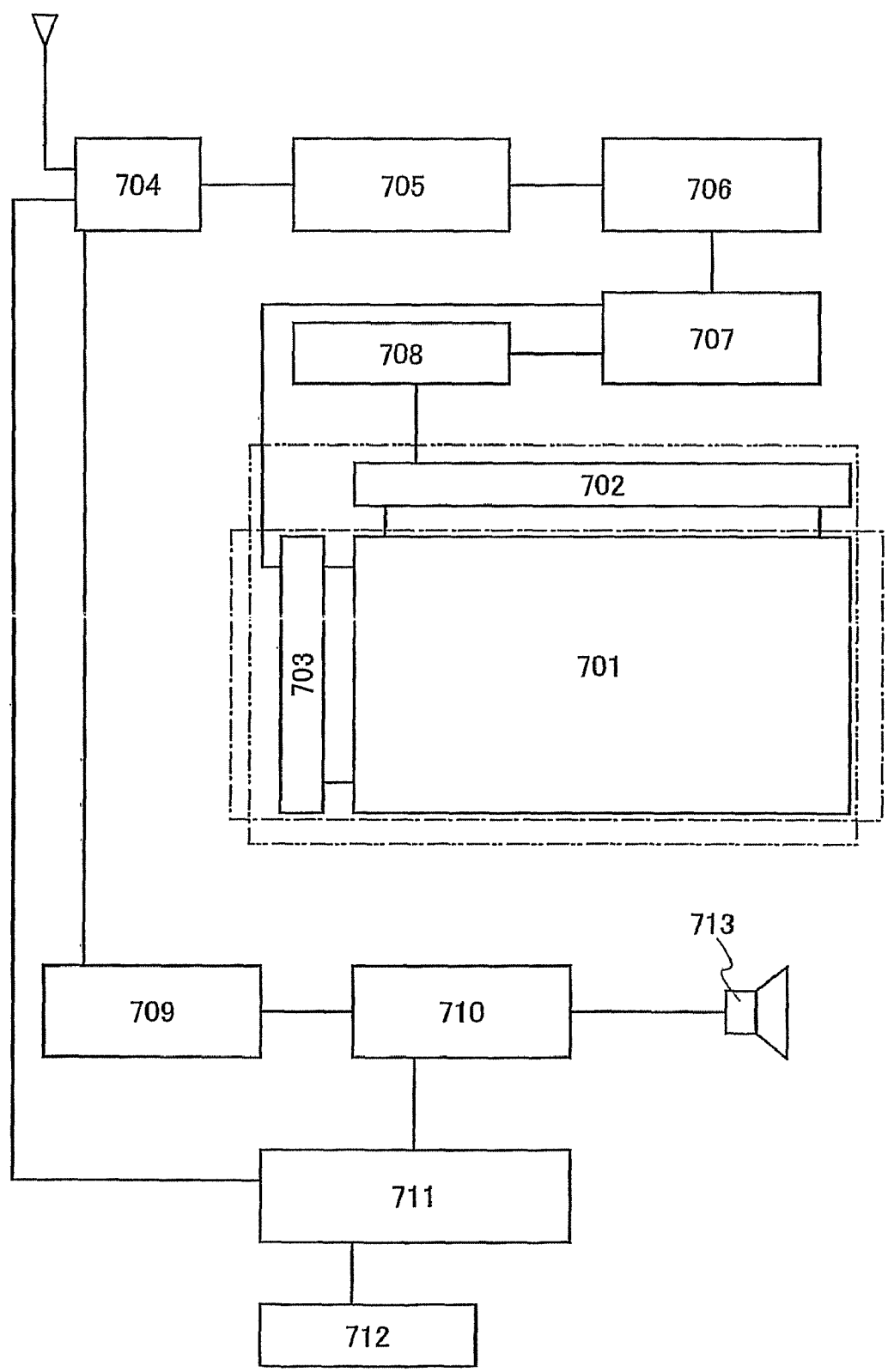
FIG. 8 is a block diagram showing main constituents of a television device using a display device according to the present invention.

A brief explanation of the main structure of the television device is given with reference to a block diagram in FIG. 8. In FIG. 8, an EL display panel 701 is manufactured using a display device according to the present invention. As a connecting method of the EL display panel 701 and an external circuit, are given the following methods as examples: 1: a method of integrating a pixel portion of a display panel and a scanning line driver circuit 703 over a substrate and further mounting a signal line driver circuit 702 separately as a driver IC, 2: a method in which only a pixel portion of a display panel is formed and a scanning line driver circuit 703 and a signal line driver circuit 702 are mounted by a TAB method, and 3: a method in which a pixel portion of a display panel and a scanning line driver circuit 703 and a signal line driver circuit 702 are each mounted in the periphery of the pixel portion by a COG method, and other methods. Any method thereof may be employed.

The structure of other external circuits includes a video wave amplifier circuit 705 that amplifies a video signal among signals received by a tuner 704; a video signal processing circuit 706 that converts the signal outputted from the video wave amplifier circuit 705 into a color signal corresponding to each color of red, green, and blue; a control circuit 707 that converts the video signal to input specification of the driver IC; and the like on an input side of video signals. The control circuit 707 outputs signals to a scanning line side and a signal line side, respectively. In the case of digital driving, a signal dividing circuit 708 may be provided on the signal line side to supply an input digital signal by dividing the input digital signal into m pieces.

Among signals received by the tuner 704, an audio signal is transmitted to an audio wave amplifier circuit 709 and the output signal is supplied to a speaker 713 via an audio signal processing circuit 710. A controlling circuit 711 receives information on controlling a receiving station (received frequency) or volume from an input portion 712 and sends a signal to the tuner 704 and the audio signal processing circuit 710.

Figure 7F:
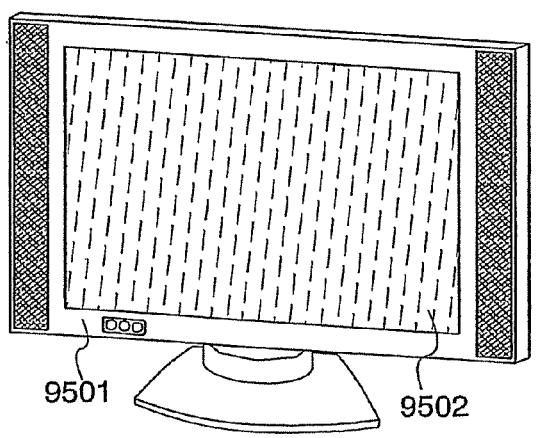

The television device as shown in FIG. 7F can be completed by installing such external circuits and the EL display panel in a casing. It is clear that the present invention is not limited to the television device but can be used in various devices, especially as a large display medium such as a monitor of a personal computer, an information board in a station or airport, or an advertisement board in the street. This example can be freely combined with Embodiment and other examples.

EXAMPLE 5

A display device according to the present invention can be used as an ID card capable of sending and receiving data without contact by installing a functional circuit such as a memory or a processing circuit, or an antenna coil. An example of the structure of such an ID card is explained with reference to drawings.

Figure 9A:
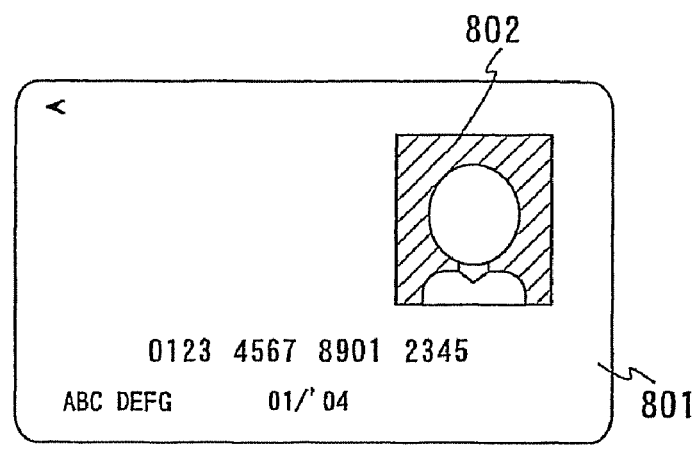
FIGS. 9A and 9B each show an ID card using a display device according to the present invention.

FIG. 9A shows one mode of an ID card incorporating a display device according to the present invention. The ID card shown in FIG. 9A is a non-contact type ID card that sends and receives data without contact to/from a reader/writer that is a terminal device. Reference numeral 801 denotes a card main body, and reference numeral 802 denotes a pixel portion of a display device installed in the card main body 801.

Figure 9B:
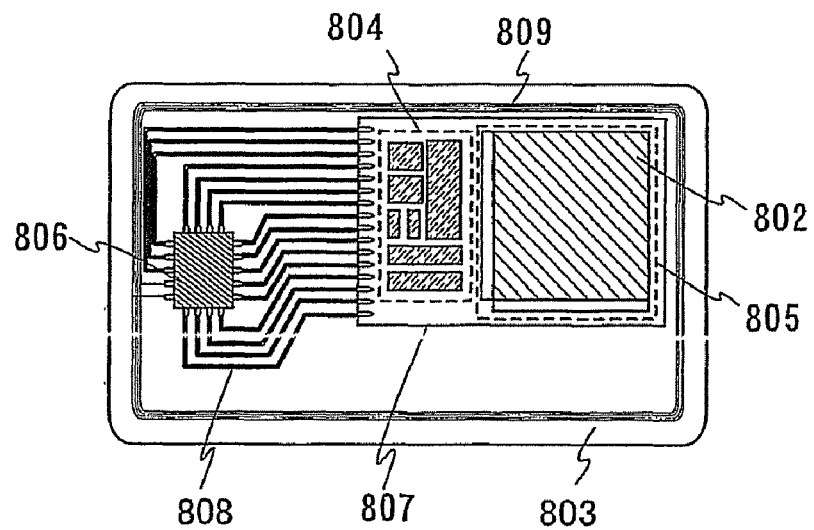

FIG. 9B shows the structure of a card substrate 803 included in the card main body 801 shown in FIG. 9A. An ID chip 804 formed of a thin semiconductor film and a display device 805 according to the above-described embodiment or examples are attached onto the card substrate 803. Both of the ID chip 804 and the display device 805 are formed over a substrate prepared separately and then transferred onto the card substrate 803. As a method of transferring, a thin film integrated circuit formed with a number of TFTs is manufactured, and the thin film integrated circuit is attached with a small vacuum tweezers or the like, or selectively attached by a UV light irradiation method. A pixel portion or a driver circuit unit in the display device can be transferred in the same manner. A portion that includes the ID chip 804 and the display device 805 and that is formed using a semiconductor thin film and then transferred onto the card substrate is referred to as a thin film portion 807.

An integrated circuit 806 manufactured using a TFT is mounted on the card substrate 803. A method of mounting the integrated circuit 806 is not especially restricted. A known method such as a COG method, a wire bonding method or a TAB method can be used. The integrated circuit 806 is electrically connected to the thin film portion 807 by a wiring 808 that is provided on the card substrate 803.

An antenna coil 809 electrically connected to the integrated circuit 806 is formed on the card substrate 803. Since data can be sent and received by the antenna coil 809 without contact with electromagnetic induction, a non-contact type ID card is less damaged due to physical abrasion than a contact type ID card. The non-contact type ID card can be used as a tag (wireless tag) that controls information without contact. The non-contact type ID card can manage so much larger amount of information than a bare code that can read information similarly without contact. Further, the distance between an object and a terminal device that can read information can be made longer than that in the case of the bar code.

FIG. 9B shows an example of forming the antenna coil 809 over the card substrate 803; however, an antenna coil manufactured separately can be mounted on the card substrate 803. For example, a copper wire or the like that has wound into a coil form and pressed between two plastic films having thicknesses of approximately 100 μm can be used as an antenna coil. Alternatively, an antenna coil can be formed in the thin film integrated circuit. One antenna coil 809 is used in one ID card in FIG. 9B; however, a plurality of the antenna coils 809 may be used.

FIGS. 9A and 9B show a mode of the ID card incorporating the display device 805; however, the present invention is not limited thereto, the display device is not always required to be provided. However, by providing the display device, the data of a photograph of the face can be displayed on the display device, thereby making replacing the photograph of the face more difficult as compared with a printing method. The display device can display information except the photograph of the face, which can improve the function of the ID card.

As the card substrate 803, a plastic substrate having flexibility can be used. ARTON made from norbornene resin having a polar group, which is manufactured by JSR Corporation, can be used as the plastic substrate. Further, a plastic substrate such as polyethylene terephthalate (PET), polyether sulfone (PBS), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), or polyimide can be used.

In this example, the electrical connection of an ID chip and a thin film integrated circuit is not limited to the modes shown in FIGS. 9A and 9B. For example, a terminal of the ID chip can be directly connected to a terminal of the thin film integrated circuit by anisotropic conductive resin, solder or the like. In FIGS. 9A and 9B, the thin film integrated circuit and the wiring provided to the card substrate can be connected with each other by a wire bonding method, a flip chip method using a solder ball, or connected directly with each other by anisotropic conductive resin, solder or the like. Further, the display device according to the present invention can be used by being built into a semiconductor device such as an ID tag, a wireless chip, or a wireless tag as well as an ID card.

EXAMPLE 6

The light-emitting element according to the present invention as described above can be applied to a pixel portion of a light-emitting device having a display function or a lighting portion of a light-emitting device having a lighting function. In this example, a circuit configuration and a driving method of the light-emitting device having a display function are explained with reference to FIGS. 10 to 13.

Figure 10:
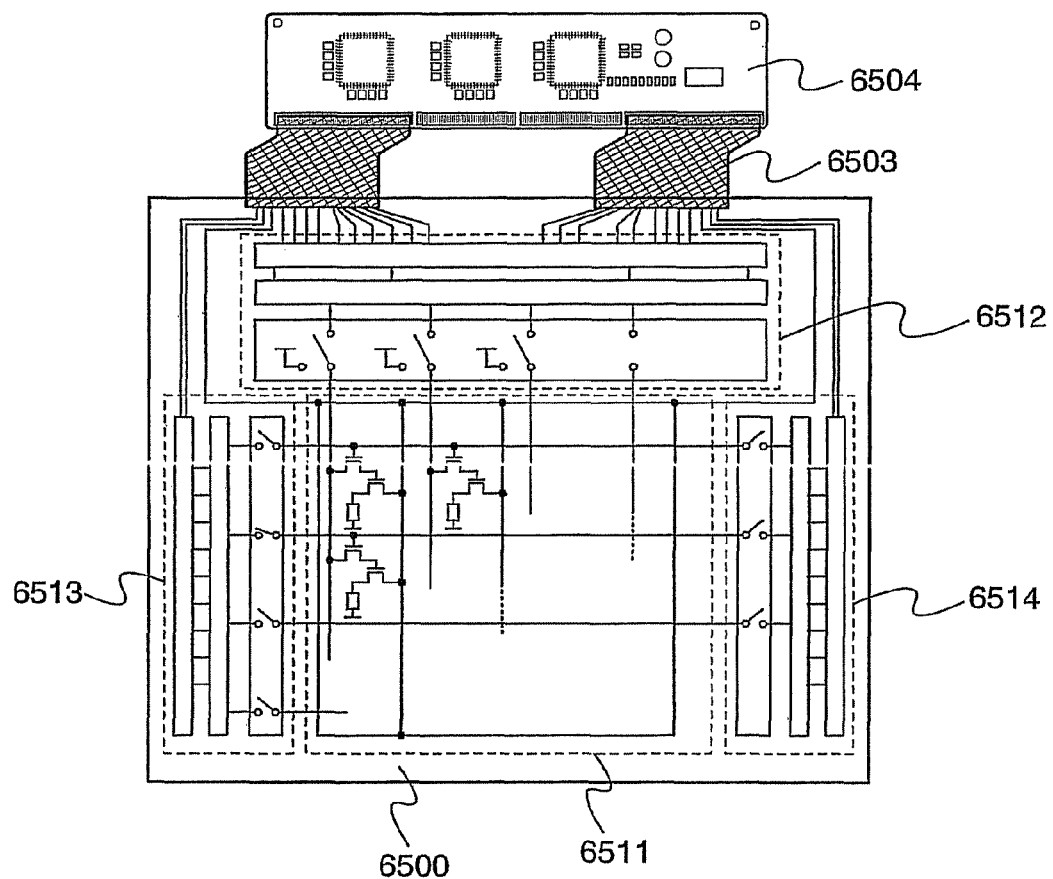
FIG. 10 is a top view of a light-emitting device according to the present invention.

FIG. 10 is a schematic view of a top face of a light-emitting device according to the present invention. A pixel portion 6511, a source signal line driver circuit 6512, a writing gate signal line driver circuit 6513, and an erasing gate signal line driver circuit 6514 are provided on a substrate 6500 in FIG. 10. The source signal line driver circuit 6512, the writing gate signal line driver circuit 6513, and the erasing gate signal line driver circuit 6514 are each connected to an FPC (flexible printed circuit) 6503 that is an external input terminal via a wiring group. Each of the source signal line driver circuit 6512, the writing gate signal line driver circuit 6513, and the erasing gate signal line driver circuit 6514 receives a video signal, a clock signal, a start signal, a reset signal, and the like from the FPC 6503. A printed wiring board (PWB) 6504 is attached to the FPC 6503. The driver circuit portion is not always required to be provided on the same substrate as the pixel portion 6511. For example, the driver circuit portion may be formed outside the substrate by using TCP or the like that is formed by mounting an IC chip on an FPC provided with a wiring pattern.

In the pixel portion 6511, a plurality of source signal lines extending in a column direction are arranged in a row direction. Current supply lines are also arranged in the row direction. In the pixel portion 6511, a plurality of gate signal lines extending in the row direction are arranged in the column direction. In the pixel portion 6511, a plurality of pixel circuits including a light-emitting element are arranged.

Figure 11:
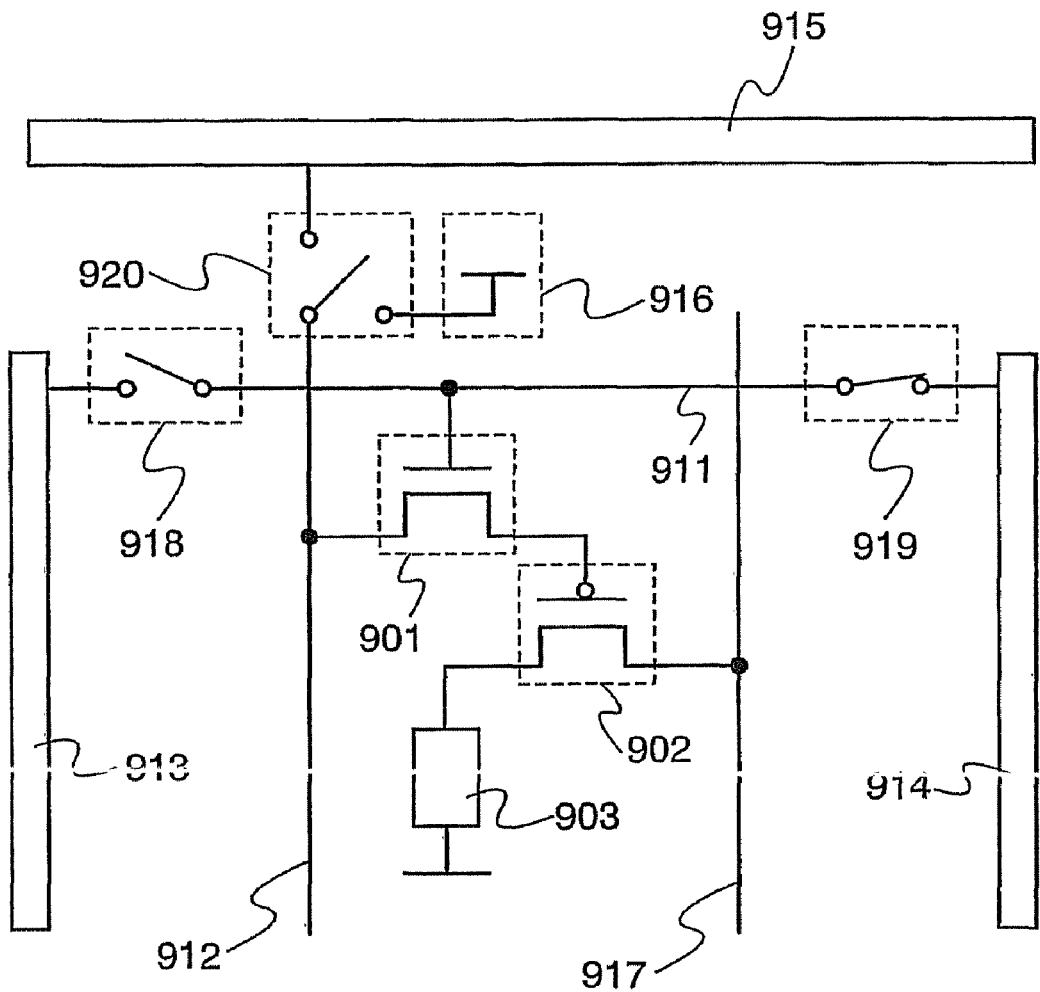
FIG. 11 is a circuit diagram explaining operation of a pixel in a light-emitting device according to the present invention.

FIG. 11 shows a circuit for operating one pixel. The circuit shown in FIG. 11 includes a first transistor 901, a second transistor 902, and a light-emitting element 903. Each of the first transistor 901 and the second transistor 902 is a three-terminal element including a gate electrode, a drain region, and a source region, in which a channel region is formed between the drain region and the source region. Because the source region and the drain region are interchanged depending on the structure, an operational condition or the like of the transistor, it is difficult to distinguish the source region from the drain region. In this example, regions to serve as a source and a drain are referred to as a first electrode and a second electrode.

A gate signal line 911 and a writing gate signal line driver circuit 913 are provided to be electrically connected or not to be electrically connected with each other via a switch 918. The gate signal line 911 and an erasing gate signal line driver circuit 914 are provided to be electrically connected or not to be electrically connected with each other via a switch 919. A source signal line 912 is provided to electrically connect to either a source signal line driver circuit 915 or a power source 916 via a switch 920. The gate of the first transistor 901 is electrically connected to the gate signal line 911. The first electrode of the first transistor 901 is electrically connected to the source signal line 912, and the second electrode of the first transistor 901 is electrically connected to the gate electrode of the second transistor 902. The first electrode of the second transistor 902 is electrically connected to a current supply line 917, and the second electrode of the second transistor 902 is electrically connected to one electrode included in the light-emitting element 903. The switch 918 may be included in the writing gate signal line driver circuit 913. The switch 919 may also be included in the erasing gate signal line driver circuit 914. The switch 920 may also be included in the source signal line driver circuit 915.

Figure 12:
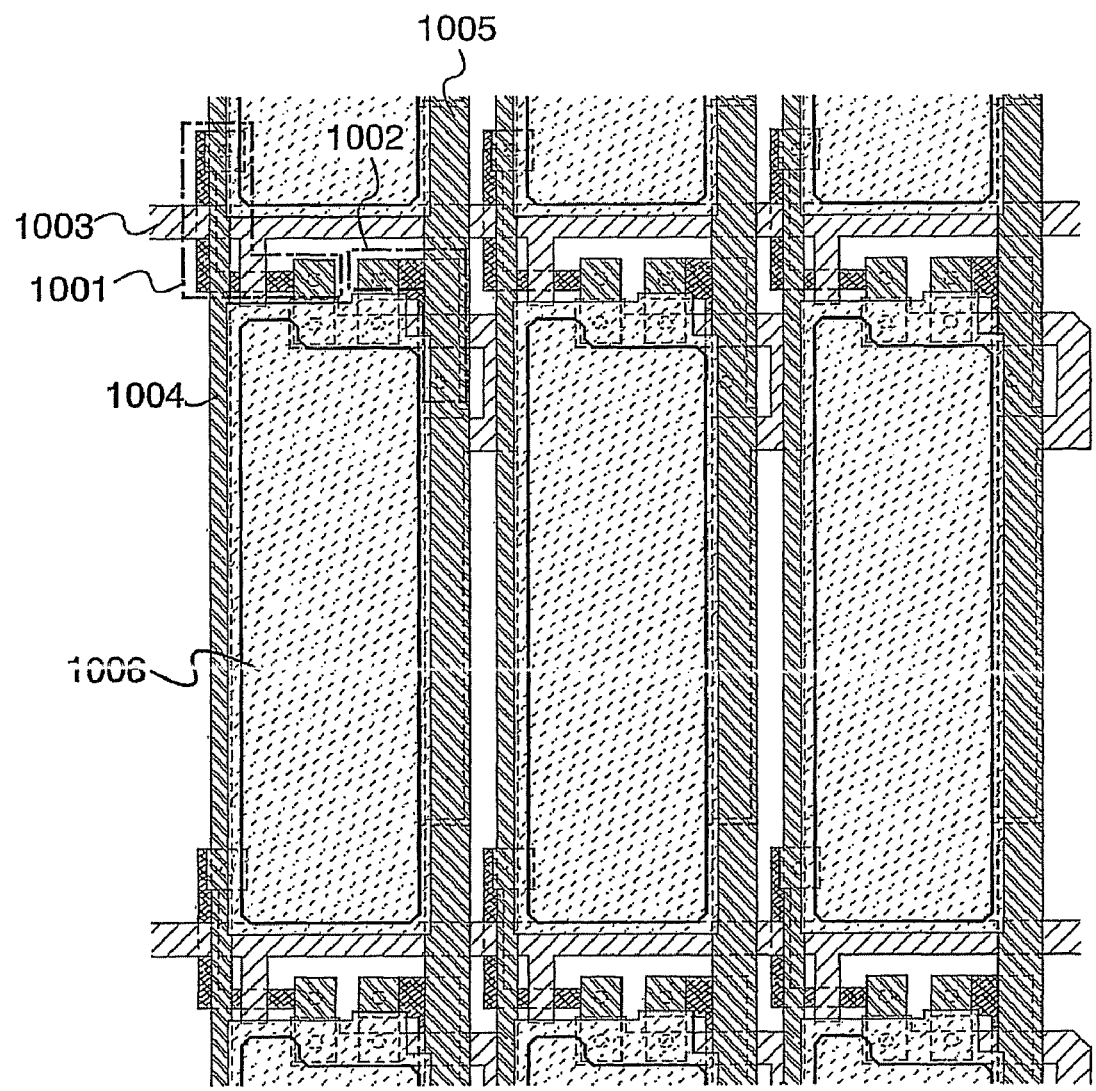
FIG. 12 is a top view of a pixel area in a light-emitting device according to the present invention.

The arrangement of a transistor, a light-emitting element and the like in the pixel portion is not especially restricted. For example, the elements can be arranged as shown in a top view of FIG. 12. In FIG. 12, a first electrode of a first transistor 1001 is connected to a source signal line 1004, and a second electrode of the first transistor 1001 is connected to a gate electrode of the second transistor 1002. A first electrode of the second transistor 1002 is connected to a current supply line 1005, and a second electrode of the second transistor is connected to an electrode 1006 of a light-emitting element. A part of a gate signal line 1003 serves as a gate electrode of the first transistor 1001.

Figure 13:
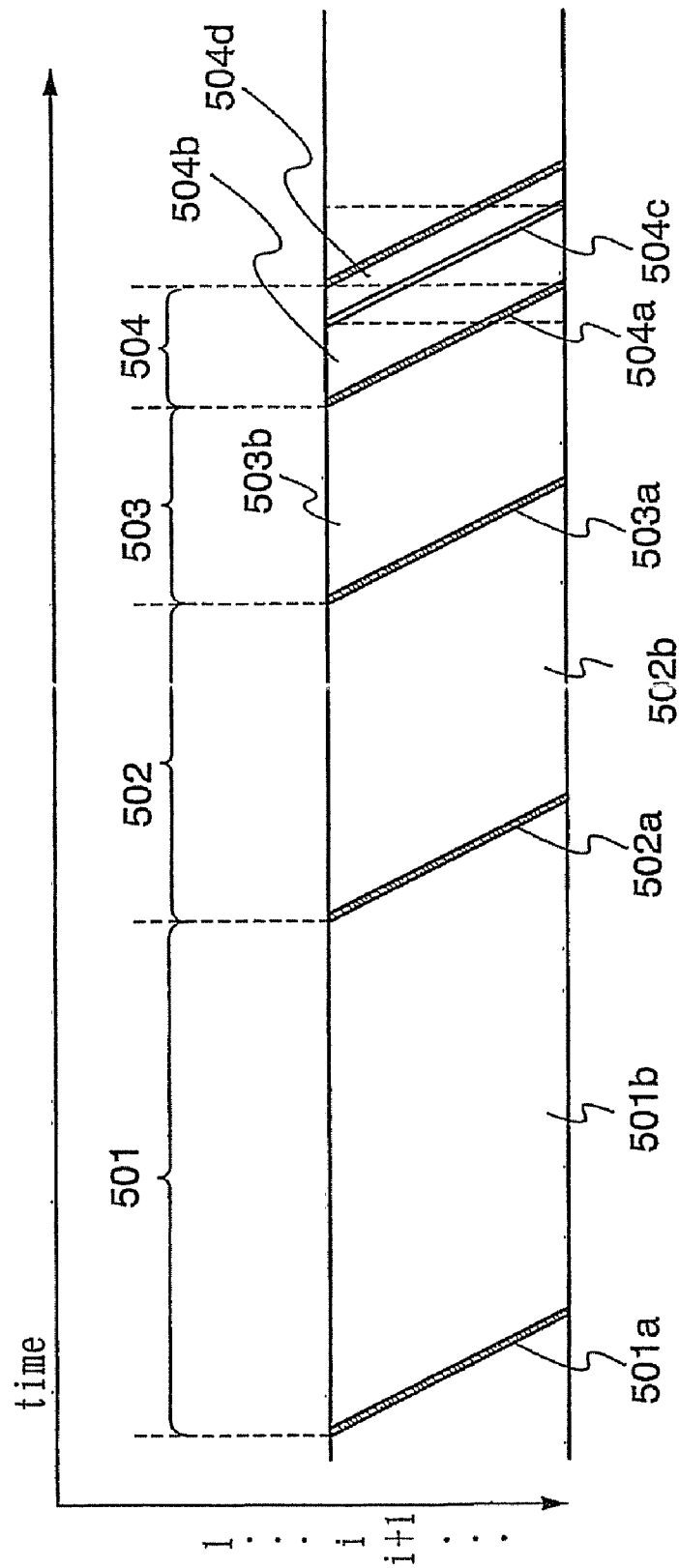
FIG. 13 shows operation of a frame period with time.
Figure 14:
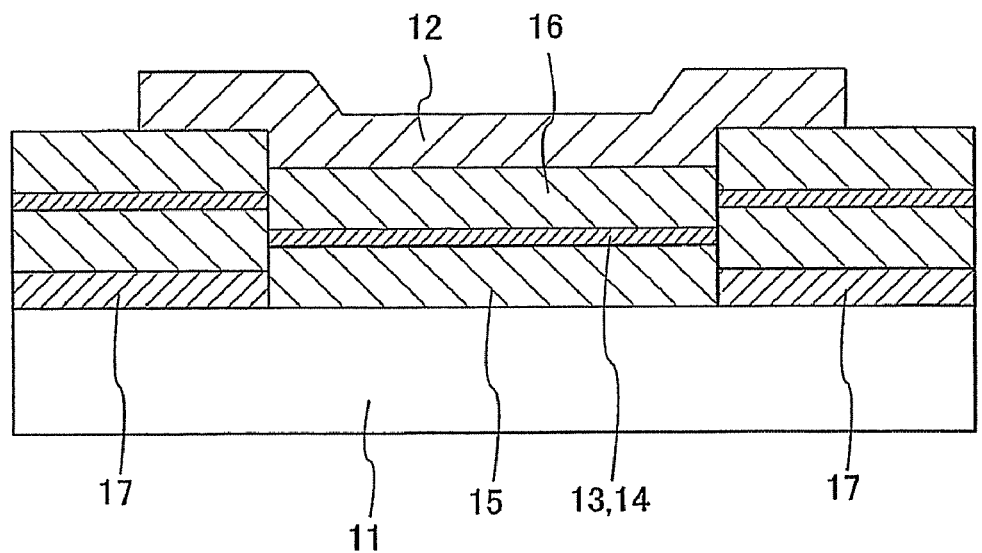
FIG. 14 shows a structure of a conventional light-emitting device.

Next, a driving method is explained. FIG. 13 is an explanatory view of an operation of a frame with time. In FIG. 13, the abscissa-axis direction represents time passage, whereas the ordinate-axis direction represents scanning stages of a gate signal line.

When an image is displayed with a light-emitting device according to the present invention, a rewriting operation and a displaying operation are repeatedly carried out in a display period. The number of rewriting operations is not especially restricted; however, the rewriting operation is preferably performed approximately sixty times per one second so that a person who watches the image does not find flickering. Herein, the period when the operations of rewriting and displaying of one image (one frame) are carried out is referred to as one frame period.

One frame period is time-divided into four sub frame periods 501, 502, 503, and 504 including writing periods 501a, 502a, 503a, and 504a, and retention periods 501b, 502b, 503b, and 504b. A light-emitting element that receives a light-emission signal emits light in the retention period. The length ratio of the retention period in each of the first sub frame period 501, the second sub frame period 502, the third sub frame period 503, and the fourth sub frame period 504 is $2^3:2^2:2^1:2^0=8:4:2:1$. Accordingly, a 4-bit gray scale can be realized. The number of bits or gray scale levels is not limited thereto. For instance, an 8-bit gray scale can be offered by providing eight sub frame periods.

An operation in one frame period is explained. Firstly, a writing operation is carried out from the first row to the last row sequentially in the sub frame period 501. Therefore, the starling time of a writing period is different depending on the rows. The retention period 501b starts in the row where the writing period 501a is completed. In the retention period, a light-emitting element that receives a light-emission signal emits light. The sub frame period 502 starts in the row where the retention period 501b is completed, and a writing operation is carried out from the first row to the last row sequentially as is the case with the sub frame period 501. Operations as noted above are repeatedly carried out to finish the retention period 504b of the sub frame period 504. When an operation in the sub frame period 504 is finished, an operation in the next frame period is started. The sum of emitting time in each of the sub frame periods is an emitting time of each light-emitting element in one frame period. By varying the emitting time for each light-emitting element to be variously combined in one pixel, various colors can be displayed with different brightness and chromaticity.

Figure 15:
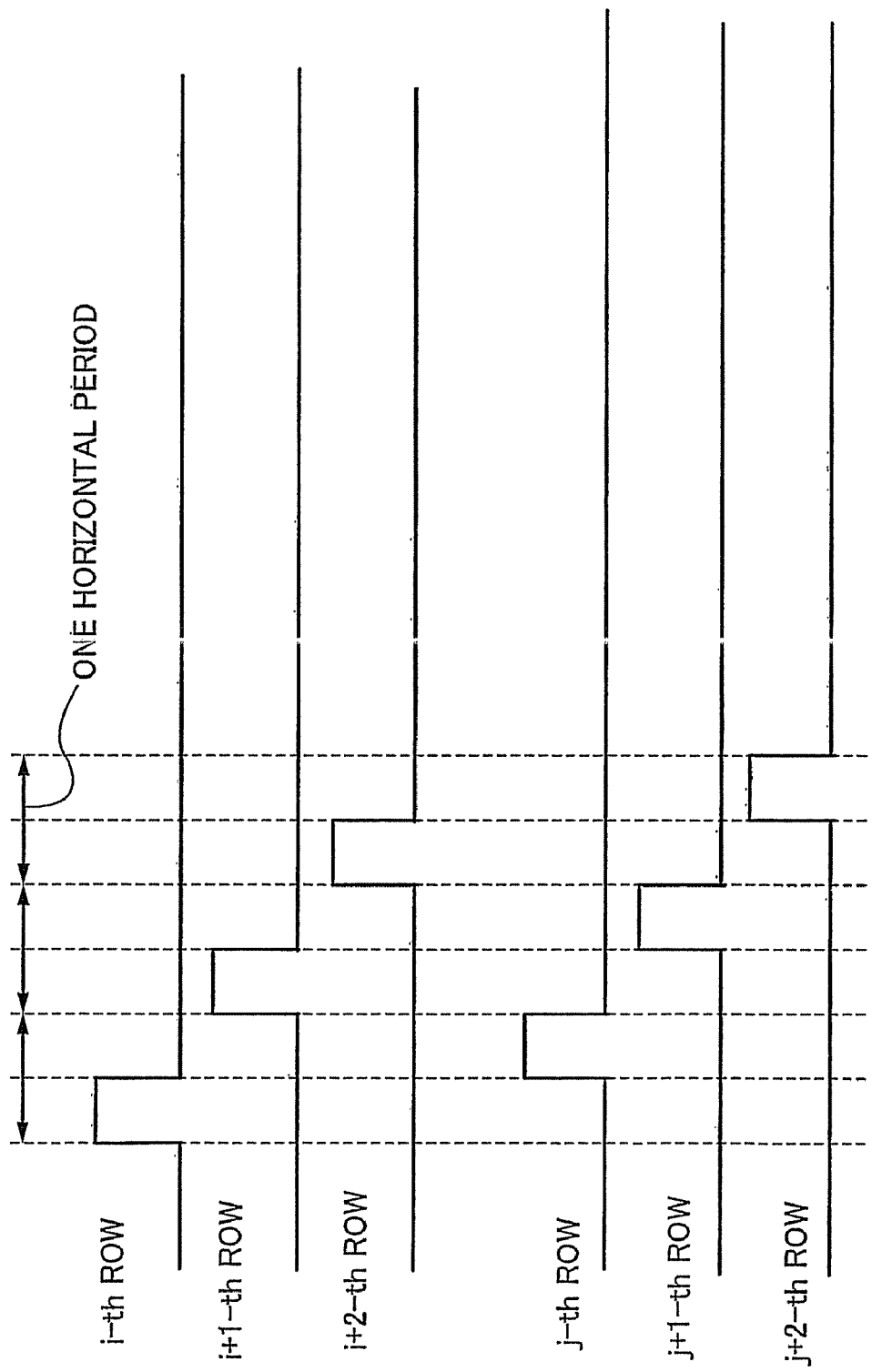
FIG. 15 shows a method for selecting a plurality of gate signal lines at the same time in one horizontal period.

When a retention period in the row where writing has been finished before finishing the writing of the last row and the retention period has started is intended to be terminated forcibly like the sub frame period 504, an erasing period 504c is provided after the retention period 504b to control so that the light-emission is forcibly stopped. The row where the light-emission is forcibly stopped does not emit light during a fixed period (the period is referred to as a non-light emission period 504d). Upon finishing the writing period of the last row, the next writing period (or a frame period) starts from the first row. In order that writing is carried out in a pixel of a certain row and an erasing signal for allowing a pixel not to emit light is input into a pixel of a certain row, as shown in FIG. 15, one horizontal period is divided into two periods, either of which is used to write and the other of which is used to erase. In the divided horizontal period, each gate signal line 911 is selected to input a corresponding signal to the source signal line 912. For instance, the former horizontal period selects the i-th row, and the later horizontal period selects the j-th row in one horizontal period. Hence, it is possible to operate as if two rows are selected simultaneously in the horizontal period. That is, a video signal is written into a pixel in the writing periods 501a to 504a using a writing period of each horizontal period, and at this time, a pixel is not selected in an erasing period in the horizontal period. A signal written into a pixel in the erasing period 504c is erased by using an erasing period in another horizontal period, and at this time, a pixel is not selected in a writing period in the horizontal period. Therefore, a display device having a pixel with a high aperture ratio can be provided and manufacturing yields can be improved.

In this example, the sub frame periods 501 to 504 are arranged in the order from the longest retention period; however, the present invention is not limited thereto. For instance, the sub frame periods 501 to 504 may be arranged in the order from the shortest retention period. The sub frame periods 501 to 504 may be arranged at random combining short sub frame periods and long sub frame periods. The sub frame period may be further divided into a plurality of frame periods. That is, scanning of the gate signal line can be carried out a plurality of times during the period of giving the same video signal.

An operation in a writing period and an erasing period of the circuit shown in FIG. 11 is explained. First, an operation in the writing period is explained. In the writing period, the gate signal line 911 in the i-th row (i is a natural number) is electrically connected to the writing gate signal line driver circuit 913 via the switch 918. The gate signal line 911 is not connected to the erasing gate signal line driver circuit 914. The source signal line 912 is electrically connected to the source signal line driver circuit 915 via the switch 920. A signal is inputted to the gate of the first transistor 901 connected to the gate signal line 911 in the i-th row, and the first transistor 901 is turned ON. At this time, video signals are simultaneously inputted to the source signal lines in the first column to the last column. Video signals inputted from the source signal line 912 at each column are independent from each other. The video signal inputted from the source signal line 912 is inputted to the gate electrode of the second transistor 902 via the first transistor 901 connected to each source signal line. The signal inputted to the gate electrode of the second transistor 902 controls ON/OFF of the second transistor 902. When the second transistor 902 is turned ON, voltage is applied to the light-emitting element 903 and current flows to the light-emitting element 903. Emission or non-emission of the light-emitting element 903 is determined depending on a signal inputted to the gate electrode of the second transistor 902. For example, in the case that the second transistor 902 is a p-channel type, the light-emitting element 903 emits light when a Low Level signal is inputted to the gate electrode of the second transistor 902. On the other hand, in the case that the second transistor 902 is an n-channel type, the light-emitting element 903 emits light when a High Level signal is inputted to the gate electrode of the second transistor 902.

Then, an operation in the erasing period is explained. In the erasing period, the gate signal line 911 of the j-th row (j is a natural number) is electrically connected to the erasing gate signal line driver circuit 914 via the switch 919. The gate signal line 911 is not connected to the writing gate signal line driver circuit 913. The source signal line 912 is electrically connected to the power source 916 via the switch 920. A signal is inputted to the gate of the first transistor 901 connected to the gate signal line 911 in the j-th row, and the first transistor 901 is turned ON. At this time, erase signals are simultaneously inputted to the source signal lines in the first column to the last column. The erase signal inputted from the source signal line 912 is inputted to the gate electrode of the second transistor 902 via the first transistor 901 connected to each source signal line. By the erase signal inputted to the gate electrode of the second transistor 902, the second transistor 902 is turned OFF and current supply from the current supply line 917 to the light-emitting element 903 is stopped. The light-emitting element 903 does not emit light forcibly. For example, in the case that the second transistor 902 is a p-channel type, the light-emitting element 903 does not emit light when a High Level signal is inputted to the gate electrode of the second transistor 902. On the other hand, in the case that the second transistor 902 is an n-channel type, the light-emitting element 903 does not emit light when a Low Level signal is inputted to the gate electrode of the second transistor 902.

In the erasing period, a signal for erasing is inputted to the j-th row by the operation as described above. However, there is a case that the j-th row is in an erasing period and another row (the i-th row in this instance) is in a writing period. In this instance, it is required that a signal for erasing is inputted to the j-th row and a signal for writing is inputted to the i-th row by utilizing a source signal line of the same column. Accordingly, an operation explained as follows is preferably carried out.

Immediately after the light-emitting element 903 in the (j−1)-th row is brought into a non emission state by the operation in the erase state, the gate signal line 911 is disconnected from the erasing gate signal line driver circuit 914, and the source signal line 912 is connected to the source signal line driver circuit 915 by changing the switch 920. As well as connecting the source signal line 912 to the source signal line driver circuit 915, the gate signal line 911 is connected to the writing gate signal line driver circuit 913 by changing the switch 918. A signal is selectively inputted to the gate signal line 911 in the i-th row from the writing gate signal line driver circuit 913, and when the first transistor 901 is turned ON, video signals for writing are inputted to the source signal lines 912 in the first column to the last column from the source signal line driver circuit 915. The light-emitting element 903 in the i-th row emits light or no light depending on the video signal.

Immediately after finishing the writing period of the i-th row as noted above, an erasing period in the j-th row starts. Hence, the gate signal line and the writing gate signal driver circuit 913 are disconnected by changing the switch 918, and the source signal line 912 and the power source 916 are connected by changing the switch 920. Further, the gate signal line 911 and the writing gate signal line driver circuit 913 are disconnected, and the gate signal line 911 is connected to the erasing gate signal line driver circuit 914 by changing the switch 919. When a signal is selectively inputted to the gate signal line 911 in the j-th row from the erasing gate signal line driver circuit 914, and the first transistor 901 is turned ON, an erase signal is inputted from the power source 916. By the erase signal, the light-emitting element 903 does not emit light forcibly. Immediately after finishing the erasing period in the j-th row, a writing period in the (i+1)-th row starts. Hereinafter, an erasing period and a writing period may be carried out repeatedly to operate to complete an erasing period of the last row.

In this example, a mode in which the writing period in the i-th row is provided between the erasing period of the (j−1)-th row and the erasing period of the j-th row is explained. Without being limited to this, however, the writing period of the i-th row may be provided between the erasing period of the j-th row and the erasing period of the (j+1)-th row.

In this example, when providing the non-light emission period 504d as in the sub frame period 504, an operation of disconnecting the erasing gate signal line driver circuit 914 from a certain gate signal line and connecting the writing gate signal line driver circuit 913 to another gate signal line is repeatedly carried out. Such an operation may be carried out in a frame period that is not provided with a non-light emission period. This example can be freely combined with Embodiment and the other examples.

One feature of a light-emitting element according to the present invention is that, in an EL element having a plurality of light-emitting layers between a pixel electrode and an opposite electrode, an intermediate conductive layer is formed between each light-emitting layer, and in the intermediate conductive layer (at least one intermediate conductive layer in the case where plural intermediate conductive layers are formed), either a hole-injecting layer or an electron-injecting layer is formed to be island-like, instead of being film-like. Various effects can be obtained by employing such a structure, such as the effect that transparency of a material for the electron-injecting (or hole-injecting) layer of an intermediate conductive layer is not required to be considered; the effect that light from the light-emitting layer is not mostly absorbed into the intermediate conductive layer; the effect that the crystallinity of materials of intermediate conductive layers is not needed to be considered; and the effect that manufacturing time of an element can be shortened.

A light-emitting element having the operation effects can be adopted in a display device typified by an EL display. Such display devices are classified into two type systems, namely, a system in which a light-emitting layer and an intermediate conductive layer are formed between two kinds of stripe-shaped electrodes that are arranged to be at right angels to each other (simple active matrix system), and a system in which a light-emitting layer and an intermediate conductive layer are formed between a pixel electrode and an opposite electrode that are connected to TFTs and arranged in matrix (active matrix system). A light-emitting element according to the present invention can be applied to the simple matrix type and the active matrix type. Moreover, the display device can be mounted on various electronic devices and ubiquitous products such as an ID card, and thus the availability of the present invention is wide-ranging. The present application is based on Japanese Priority Application No. 2004-151103 filed on May 20, 2004 with the Japanese Patent Office, the entire contents of which are hereby incorporated by reference.

The invention claimed is:
1. A light-emitting element comprising:
a first electrode;
a first light-emitting layer over the first electrode;
an intermediate conductive layer on the first light-emitting layer;
a second light-emitting layer on the intermediate conductive layer; and
a second electrode over the second light-emitting layer,
wherein the intermediate conductive layer comprises an electron-injecting layer and a hole-injecting layer that is in contact with the electron-injecting layer,
wherein the electron-injecting layer and the hole-injecting layer are in contact with the first light-emitting layer, and
wherein the electron-injecting layer comprises at least one island-like structure.

2. The light-emitting element according to claim 1, wherein the electron-injecting layer comprises a metal having a low work function.

3. The light-emitting element according to claim 1, wherein the first electrode is a pixel electrode and the second electrode is an opposite electrode.

4. The light-emitting element according to claim 1, wherein the hole-injecting layer comprises molybdenum oxide and aromatic amine.

5. The light-emitting element according to claim 1, wherein the island-like structure is dotted in an island-shaped state.

6. A light-emitting element comprising:
a first electrode;
a plurality of light-emitting layers;
a plurality of intermediate conductive layers sandwiched by the plurality of light-emitting layers; and
a second electrode,
wherein the first electrode, the plurality of light-emitting layers, the plurality of intermediate conductive layers sandwiched by the plurality of light-emitting layers, the second electrode are stacked,
wherein at least one of the intermediate conductive layers includes an electron-injecting layer and a hole-injecting layer that is in contact with the electron-injecting layer,
wherein the electron-injecting layer and the hole-injecting layer are in contact with at least one of the plurality of light-emitting layer, and
wherein the electron-injecting layer comprises at least one island-like structure.

7. The light-emitting element according to claim 6, wherein the electron-injecting layer comprises a metal having a low work function.

8. The light-emitting element according to claim 6, wherein the first electrode is a pixel electrode and the second electrode is an opposite electrode.

9. The light-emitting element according to claim 6, wherein the hole-injecting layer comprises molybdenum oxide and aromatic amine.

10. The light-emitting element according to claim 6 wherein the island-like structure is dotted in an island-shaped state.

11. A light-emitting element comprising:
an n number of light-emitting layers (where n is an integer equal to or greater than 2) comprising a first through an n-th light-emitting layers between a first electrode and a second electrode,
wherein an intermediate conductive layer is formed between a k-th light-emitting layer (where k is an integer of $1 \leq k \leq (n-1)$) and a (k+1)th light-emitting layer,
wherein the intermediate conductive layer comprises an electron-injecting layer and a hole-injecting layer that is in contact with the electron-injecting layer,
wherein the electron-injecting layer and the hole-injecting layer are in contact with the k-th light-emitting layer, and
wherein the electron-injecting layer comprises at least one island-like structure.

12. The light-emitting element according to claim 11, wherein the electron-injecting layer comprises a metal having a low work function.

13. The light-emitting element according to claim 11, wherein the first electrode is a pixel electrode and the second electrode is an opposite electrode.

14. The light-emitting element according to claim 11, wherein the hole-injecting layer comprises molybdenum oxide and aromatic amine.

15. The light-emitting element according to claim 11, wherein the island-like structure is dotted in an island-shaped state.

16. A display device having a light-emitting element comprising:
a first electrode;
a first light-emitting layer over the first electrode;
an intermediate conductive layer on the first light-emitting layer;
a second light-emitting layer on the intermediate conductive layer; and
a second electrode over the second light-emitting layer,
wherein the intermediate conductive layer comprises an electron-injecting layer and a hole-injecting layer that is in contact with the electron-injecting layer,
wherein the electron-injecting layer and the hole-injecting layer are in contact with the first light-emitting layer,
wherein the electron-injecting layer comprises at least one island-like structure, and
wherein the light-emitting element is connected to a transistor formed over a substrate through an interlayer insulating film.

17. The light-emitting element according to claim 16, wherein the electron-injecting layer comprises a metal having a low work function.

18. The light-emitting element according to claim 16, wherein the first electrode is a pixel electrode and the second electrode is an opposite electrode.

19. The light-emitting element according to claim 16, wherein the hole-injecting layer comprises molybdenum oxide and aromatic amine.

20. The light-emitting element according to claim 16, wherein the island-like structure is dotted in an island-shaped state.

21. A display device having a light-emitting element comprising:
a first electrode;
a plurality of light-emitting layers;
a plurality of intermediate conductive layers sandwiched by the plurality of light-emitting layers; and
a second electrode,
wherein the first electrode, the plurality of light-emitting layers, the plurality of intermediate conductive layers sandwiched by the plurality of light-emitting layers, the second electrode are stacked,
wherein at least one of the intermediate conductive layers includes an electron-injecting layer and a hole-injecting layer that is in contact with the electron-injecting layer,
wherein the electron-injecting layer and the hole-injecting layer are in contact with at least one of the plurality of light-emitting layer,
wherein the electron-injecting layer comprises at least one island-like structure, and
wherein the light-emitting element is connected to a transistor formed over a substrate through an interlayer insulating film.

22. The light-emitting element according to claim 21, wherein the electron-injecting layer comprises a metal having a low work function.

23. The light-emitting element according to claim 21, wherein the first electrode is a pixel electrode and the second electrode is an opposite electrode.

24. The light-emitting element according to claim 21, wherein the hole-injecting layer comprises molybdenum oxide and aromatic amine.

25. The light-emitting element according to claim 21, wherein the island-like structure is dotted in an island-shaped state.

26. A display device having a light-emitting element comprising:
the light emitting element formed by sequentially laminating an n number of light-emitting layers (where n is an integer equal to or greater than 2) comprising a first through an n-th light-emitting layers between a first electrode and a second electrode, wherein an intermediate conductive layer is formed between a k-th light-emitting layer (where k is an integer of $1 \leq k \leq (n-1)$) and a (k+1)th light-emitting layer, wherein the intermediate conductive layer comprises an electron-injecting layer and a hole-injecting layer that is in contact with the electron-injecting layer, wherein the electron-injecting layer and the hole-injecting layer are in contact with the k-th light-emitting layer, wherein the electron-injecting layer comprises at least one island-like structure, and wherein the light-emitting element is connected to a transistor formed over a substrate through an interlayer insulating film.

27. The light-emitting element according to claim 26, wherein the electron-injecting layer comprises a metal having a low work function.

28. The light-emitting element according to claim 26, wherein the first electrode is a pixel electrode and the second electrode is an opposite electrode.

29. The light-emitting element according to claim 26, wherein the hole-injecting layer comprises molybdenum oxide and aromatic amine.

30. The light-emitting element according to claim 26, wherein the island-like structure is dotted in an island-shaped state.

31. The light-emitting element according to claim 1, wherein at least one of the first light-emitting layer and the second light-emitting layer comprises a hole-transporting layer and an electron-transporting layer.

32. The light-emitting element according to claim 6, wherein at least one of the plurality of light-emitting layers comprises a hole-transporting layer and an electron-transporting layer.

33. The light-emitting element according to claim 11, wherein at least one of the n number of light-emitting layers comprises a hole-transporting layer and an electron-transporting layer.

34. The light-emitting element according to claim 16, wherein at least one of the first light-emitting layer and the second light-emitting layer comprises a hole-transporting layer and an electron-transporting layer.

35. The light-emitting element according to claim 21, wherein at least one of the plurality of light-emitting layers comprises a hole-transporting layer and an electron-transporting layer.

36. The light-emitting element according to claim 26, wherein at least one of the n number of light-emitting layers comprises a hole-transporting layer and an electron-transporting layer.

37. The light-emitting element according to claim 1, wherein the electron-injecting layer comprises lithium and aluminum.

38. The light-emitting element according to claim 6, wherein the electron-injecting layer comprises lithium and aluminum.

39. The light-emitting element according to claim 11, wherein the electron-injecting layer comprises lithium and aluminum.

40. The light-emitting element according to claim 16, wherein the electron-injecting layer comprises lithium and aluminum.

41. The light-emitting element according to claim 21, wherein the electron-injecting layer comprises lithium and aluminum.

42. The light-emitting element according to claim 26, wherein the electron-injecting layer comprises lithium and aluminum.

* * * * *

UNITED STATES PATENT AND TRADEMARK OFFICE
CERTIFICATE OF CORRECTION

PATENT NO. : 8,339,039 B2
APPLICATION NO. : 13/229918
DATED : December 25, 2012
INVENTOR(S) : Shunpei Yamazaki et al.

It is certified that error appears in the above-identified patent and that said Letters Patent is hereby corrected as shown below:

In the specification:

Column 1, Line 62; Change "the In—Th—O" to --the In—Zn—O--.
Column 3, Lines 38 thru 39; Change "election" to --electron--.
Column 11, Line 55; Change "microcrystnlline" to --microcrystalline--.
Column 13, Line 39; Change "Mo, of an" to --Mo, or an--.
Column 15, Line 29; Change "R, Q and B" to --R, G, and B--.
Column 20, Line 66; Change "bare" to --bar--.
Column 21, Line 28; Change "(PBS)" to --(PES)--.
Column 23, Line 26; Change "starling" to --starting--.

Signed and Sealed this
Second Day of April, 2013

Teresa Stanek Rea
*Acting Director of the United States Patent and Trademark Office*